(12) United States Patent
Reghetti et al.

(10) Patent No.: US 8,600,706 B2
(45) Date of Patent: Dec. 3, 2013

(54) SYSTEMS AND METHODS FOR IDENTIFYING CRASH SOURCES IN A CAD ENVIRONMENT

(75) Inventors: Joseph P. Reghetti, Reno, NV (US); Phillip M. Schaeffer, Henderson, NV (US)

(73) Assignee: Auto Prep, LLC, Henderson, NV (US)

( * ) Notice: Subject to any disclaimer, the term of this patent is extended or adjusted under 35 U.S.C. 154(b) by 945 days.

(21) Appl. No.: 12/716,929

(22) Filed: Mar. 3, 2010

(65) Prior Publication Data

US 2010/0251028 A1    Sep. 30, 2010

Related U.S. Application Data

(63) Continuation-in-part of application No. 12/150,845, filed on May 1, 2008, and a continuation-in-part of application No. 12/150,792, filed on May 1, 2008, now Pat. No. 8,368,717, and a continuation-in-part of application No. 12/598,418, filed as application No. PCT/US2008/005602 on May 1, 2008.

(60) Provisional application No. 61/157,460, filed on Mar. 4, 2009, provisional application No. 60/915,198, filed on May 1, 2007, provisional application No. 60/915,195, filed on May 1, 2007.

(51) Int. Cl.
*G06F 17/50* (2006.01)
*G06F 17/00* (2006.01)
*G06G 7/48* (2006.01)
*G09G 5/00* (2006.01)

(52) U.S. Cl.
USPC ........ 703/1; 703/7; 703/8; 345/418; 345/654; 345/680

(58) Field of Classification Search
None
See application file for complete search history.

(56) References Cited

U.S. PATENT DOCUMENTS

| 3,636,328 A | 1/1972 | Korelitz et al. |
| 4,179,751 A | 12/1979 | Adachi |
| 4,275,449 A | 6/1981 | Aish |

(Continued)

FOREIGN PATENT DOCUMENTS

| WO | WO 2008/137023 | 11/2008 |
| WO | WO 2010/102064 | 9/2010 |

OTHER PUBLICATIONS

"Arris Learning Guide", Version 8.1. Mar. 23, 2004. Sigma Design, LLC, 1-62.

(Continued)

*Primary Examiner* — Saif Alhija
*Assistant Examiner* — Nithya J Moll
(74) *Attorney, Agent, or Firm* — Woodcock Washburn LLP

(57) ABSTRACT

Systems and methods that automatically identify causes of errors during one or more CAD processes, such as while binding external reference drawings to a host drawing and/or batch comparing sets of multiple drawings. In certain examples, a first session of a CAD program can be used to track potential crash occurrences during a second CAD program's processing of a set of drawings and dynamically replace corrupt drawings and/or broken references with blank (proxy) drawings so that the desired process can complete. Whenever the first CAD session detects a potential error event, such as when the second CAD session is interrupted for a particular length of time, the first CAD session can log the error, close the second session, and/or continue the desired process with a new CAD session.

18 Claims, 27 Drawing Sheets

(56) References Cited

U.S. PATENT DOCUMENTS

| | | |
|---|---|---|
| 4,353,117 A | 10/1982 | Spellman |
| 4,427,974 A | 1/1984 | Sheahan |
| 4,464,719 A | 8/1984 | Spellman |
| 4,551,810 A | 11/1985 | Levine |
| 4,700,317 A | 10/1987 | Watanabe et al. |
| 4,700,318 A | 10/1987 | Ockman |
| 4,744,658 A | 5/1988 | Holly |
| 4,774,658 A | 9/1988 | Lewin |
| 4,789,944 A | 12/1988 | Wada et al. |
| 4,811,243 A | 3/1989 | Racine |
| 4,831,546 A | 5/1989 | Mitsuta et al. |
| 4,885,694 A | 12/1989 | Pray et al. |
| 4,964,060 A | 10/1990 | Hartsog |
| 4,985,855 A | 1/1991 | Aldrich et al. |
| 4,992,953 A | 2/1991 | Yoshida et al. |
| 5,021,779 A | 6/1991 | Bisak |
| 5,021,968 A | 6/1991 | Ferketic |
| 5,103,214 A | 4/1992 | Curran et al. |
| 5,109,337 A | 4/1992 | Ferriter et al. |
| 5,111,392 A | 5/1992 | Malin |
| 5,139,044 A | 8/1992 | Otten et al. |
| 5,189,394 A | 2/1993 | Walter et al. |
| 5,227,983 A | 7/1993 | Cox et al. |
| 5,255,207 A | 10/1993 | Cornwell |
| 5,260,883 A | 11/1993 | Wilson |
| 5,299,307 A | 3/1994 | Young |
| 5,329,464 A | 7/1994 | Sumic et al. |
| 5,334,970 A | 8/1994 | Bailey |
| 5,398,277 A | 3/1995 | Martin |
| 5,414,408 A | 5/1995 | Berra |
| 5,517,428 A | 5/1996 | Williams |
| 5,546,564 A | 8/1996 | Horie |
| 5,557,537 A | 9/1996 | Normann et al. |
| 5,561,748 A | 10/1996 | Niu et al. |
| 5,608,375 A | 3/1997 | Kosich |
| 5,627,763 A | 5/1997 | Carlson |
| 5,655,087 A | 8/1997 | Hino et al. |
| 5,668,736 A | 9/1997 | Douglas et al. |
| 5,708,798 A | 1/1998 | Lynch et al. |
| 5,761,674 A | 6/1998 | Ito |
| 5,784,286 A * | 7/1998 | Hirose et al. ............ 703/1 |
| 5,808,905 A | 9/1998 | Normann et al. |
| 5,812,394 A | 9/1998 | Lewis et al. |
| 5,847,971 A | 12/1998 | Ladner et al. |
| 5,877,683 A | 3/1999 | Sheasley |
| 5,877,768 A | 3/1999 | Jain |
| 5,920,849 A | 7/1999 | Broughton et al. |
| 5,949,428 A | 9/1999 | Toelle et al. |
| 5,977,872 A | 11/1999 | Guertin |
| 5,982,931 A | 11/1999 | Ishimaru |
| 5,987,458 A | 11/1999 | Anderson et al. |
| 6,002,405 A | 12/1999 | Berroteran |
| 6,064,982 A | 5/2000 | Purl |
| 6,081,196 A | 6/2000 | Young |
| 6,119,784 A | 9/2000 | MacDonald et al. |
| 6,141,924 A | 11/2000 | Quaintance |
| 6,169,550 B1 | 1/2001 | Jain |
| 6,224,249 B1 * | 5/2001 | Ozawa et al. ............ 703/1 |
| 6,236,409 B1 | 5/2001 | Hartman |
| 6,239,708 B1 | 5/2001 | Young |
| 6,266,396 B1 | 7/2001 | Johnson |
| 6,272,447 B1 | 8/2001 | Gavin et al. |
| 6,275,160 B1 | 8/2001 | Ha |
| 6,304,790 B1 | 10/2001 | Nakamura et al. |
| 6,331,982 B1 | 12/2001 | Watanabe |
| 6,333,689 B1 | 12/2001 | Young |
| 6,333,695 B2 | 12/2001 | Young |
| 6,446,053 B1 | 9/2002 | Elliot |
| 6,457,165 B1 | 9/2002 | Ishikawa et al. |
| 6,535,121 B2 | 3/2003 | Matheny |
| 6,567,772 B1 | 5/2003 | Hoeft |
| 6,604,126 B2 | 8/2003 | Neiman et al. |
| 6,636,774 B2 | 10/2003 | Tenma et al. |
| 6,701,288 B1 | 3/2004 | Normann et al. |
| 6,760,638 B1 | 7/2004 | Love et al. |
| 6,778,081 B2 | 8/2004 | Matheny |
| 6,853,299 B2 | 2/2005 | Shiratori et al. |
| 6,879,941 B1 | 4/2005 | Ehrenberg et al. |
| 7,032,124 B2 | 4/2006 | Greenbaum |
| 7,042,468 B2 | 5/2006 | Schwegler, Jr. et al. |
| 7,047,168 B2 | 5/2006 | Carballo et al. |
| 7,047,180 B2 | 5/2006 | Mathews et al. |
| 7,062,532 B1 | 6/2006 | Sweat et al. |
| 7,085,697 B1 | 8/2006 | Rappaport et al. |
| 7,096,165 B2 | 8/2006 | Pantenburg et al. |
| 7,106,330 B2 | 9/2006 | Liu et al. |
| 7,171,341 B2 | 1/2007 | Hoeft |
| 7,176,942 B2 | 2/2007 | Chartier et al. |
| 8,306,795 B2 * | 11/2012 | Atkinson ............ 703/6 |
| 2001/0026225 A1 | 10/2001 | Young |
| 2001/0037190 A1 | 11/2001 | Jung |
| 2001/0047251 A1 | 11/2001 | Kemp |
| 2001/0052908 A1 | 12/2001 | Hartman |
| 2002/0035408 A1 | 3/2002 | Smith |
| 2002/0035450 A1 | 3/2002 | Thackston |
| 2002/0178428 A1 | 11/2002 | Horne et al. |
| 2002/0183982 A1 | 12/2002 | Rauscher |
| 2003/0061011 A1 | 3/2003 | Hoeft |
| 2003/0074164 A1 | 4/2003 | Simmons et al. |
| 2003/0135352 A1 | 7/2003 | Carballo et al. |
| 2003/0142109 A1 | 7/2003 | Brown et al. |
| 2003/0167155 A1 | 9/2003 | Reghetti et al. |
| 2004/0073410 A1 | 4/2004 | Maly et al. |
| 2004/0080407 A1 | 4/2004 | Reghetti et al. |
| 2004/0080408 A1 | 4/2004 | Reghetti et al. |
| 2004/0080409 A1 | 4/2004 | Reghetti et al. |
| 2004/0080520 A1 | 4/2004 | Reghetti et al. |
| 2004/0083080 A1 | 4/2004 | Reghetti et al. |
| 2004/0083081 A1 | 4/2004 | Reghetti et al. |
| 2005/0102051 A1 | 5/2005 | Okada et al. |
| 2005/0131619 A1 | 6/2005 | Rappaport et al. |
| 2005/0246160 A1 | 11/2005 | Zimmermann |
| 2006/0123381 A1 | 6/2006 | Nakamura et al. |
| 2007/0089087 A1 | 4/2007 | Connor et al. |
| 2007/0174026 A1 | 7/2007 | Mangon et al. |
| 2007/0174027 A1 | 7/2007 | Moiseyev |
| 2007/0179759 A1 | 8/2007 | Mangon |
| 2007/0186149 A1 | 8/2007 | Ghantous et al. |
| 2009/0148050 A1 | 6/2009 | Reghetti et al. |
| 2009/0273598 A1 | 11/2009 | Reghetti et al. |
| 2010/0121614 A1 | 5/2010 | Reghetti et al. |
| 2010/0130762 A1 | 5/2010 | Hulse |
| 2010/0138762 A1 | 6/2010 | Reghetti et al. |
| 2010/0223032 A1 | 9/2010 | Reghetti et al. |
| 2010/0250615 A1 | 9/2010 | Reghetti et al. |

OTHER PUBLICATIONS

"Arris Learning Tutorial", Version 8.1. Jun. 9, 2004. Sigma Design, LLC, 1-67.
"AutoCAD 2005", Features and Benefits 2004 Autodesk, Inc., 1-9.
"Fire-Lite Alarms" Fire-Lite Alarms, Inc. Website, Retrieved from <URL:http://firelite.com/aboutus.html>, retrieved Jun. 25, 2004, 1 page.
"MicroStation", Bentley Systems, Inc., Jan. 2003, 1-2.
"NACTool Electronic Circuit Builder Operating Instructions", Wheelock, Inc., Aug. 1-5, 2007.
"Wheelock, Inc. Design Software" Wheelock, Inc. Website, retrieved on Jun. 25, 2004, from <URL:http://wheelockinc.com/technical_support/software.html, 1 page.
Allan Wright, "FreePCB User Guide", Apr. 14, 2007, Version 1.4, 1-168.
Autodesk, "Features and Benefits", Autodesk, Inc., 111 McInnis Parkway, San Rafael, CA 94903, copyright 2004.
AutoSPRINK(r) online help, "Auto Draw Menu", 14 pages. As printed May 16, 2005.
AutoSPRINK(r) online help, "Commands Menu", 22 pages. As printed May 17, 2005.
AutoSPRINK(r) online help, "Welcome to AutoSPRINK VR4", 6 pages, printed on May 16, 2005.
Bentley, "MicroStation", product specification sheet, copyright 2003.

(56) References Cited

OTHER PUBLICATIONS

Edgar, J. A., "The Effectiveness of Fire Detection and Fire Sprinkler Systems in the Central Office Environment," Telecommunications Energy Conference, 1989, INTELEC '89, Conference Proceedings., Eleventh International, Oct. 15-18, 1989, vol. 2, pp. 21.4/1-21.4/5.

Gonzalez et al., "VISIR, A Simulation Software for Domotics Installations to Improve Laboratory Training", 31$^{st}$ ASEEIIEEE Frontiers in Education Conference, Session F4C, Oct. 10-13, 2001.

ISR and Written Opinion for PCT/US2010/026126 dated Oct. 13, 2010.

Ledermann, F., "An Authoring Framework for Augmented Reality Presentations," PhD. thesis, Vienna University of Technology, published May 12, 2004, http://www.ims.tuwien.ac.aU media/documents/publications/ledermann_thesis.pdf, 119 pages.

M.E.P. CAD, Inc., "Alarm CAD Training Manual," AutoSPRINK, © 2006, 137 pages.

M.E.P. CAD, Inc., "AutoSPRINK 2000 Fire Sprinkler Computer Aided Design: Getting Started," AutoSPRINK, © 2000, 38 pages.

M.E.P. CAD, Inc., "AutoSPRINK 2000 Fire Sprinkler Computer Aided Design: Student Workbook 1," AutoSPRINK, © 2000, 86 pages.

M.E.P. CAD, Inc., "AutoSPRINK 2000 Fire Sprinkler Computer Aided Design: Student Workbook 2," AutoSPRINK, © 2000, 112 pages.

M.E.P. CAD, Inc., "AutoSPRINK 2000 Fire Sprinkler Computer Aided Design: User Guide & Tutorial," AutoSPRINK, © 1999, 400 pages.

M.E.P. CAD, Inc., "Introducing Alarm CAD Manual™," AutoSPRINK, © 1997-2003, 56 pages.

M.E.P.CAD "AlarmCAD Getting Started" Copyright 2000.

M.E.P.CAD "AlarmCAD v.1.0.63.Beta" Copyright 2002, CD Media.

M.E.P.CAD "AlarmCAD Help File From AutoCAD v.1.0.63.787." Copyright 2002, printed May 2004.

M.E.P.CAD "AutoALARM Help File from AutoSPRINK Alarm version 1.0.42.738", Copyright 2001. As printed May 2004.

M.E.P.CAD "AutoSPRINK Help File from AutoALARM v.1.0.24.700", Copyright 2000. As printed May 2004.

MEPCAD, AutoSPRINK VR CAD Program Features, Jul. 10, 2005, 27 pages.

MEPCAD, Inc., "AutoSPRINK VR: New Features Since AutoSPRINK 2000 Release", Autoaprink VR (VR3), Jul. 2002, USA.

MEPCAD, Inc., "AutoSPRINK VR: Student Workbook", Autosprink VR (VR3), 2002, USA.

MEPCAD, Inc., "AutoSPRINK VR: Student Workbook", Autosprink VR (VR4), 2004, USA.

MEPCAD, Inc., "AutoSPRINK VR: Student Workbook", Autosprink VR5, 2005, USA.

MAPCAD, Inc., "AutoSPRINK VR4 New Features List—Version 4.0", Autosprink VR4, Jun. 21, 2004, USA.

MEPCAD, Inc., "AutoSPRINK VR5 New Features List—Version 5.0", Autosprink VR5, Sep. 28, 2005, USA.

MEPCAD, Inc., "New AutoSPRINK Features", Autosprink 2000, Oct. 1, 1999, USA.

Meshkat et al., "Analysis of Safety Systems with On-Demand and Dynamic Failure Modes", 2000 Proceedings, Annual Reliability and Maintainability Symposium, IEEE, 2000, pp. 14-21.

Meshkat et al., "Dependability Analysis of Systems with On-Demand and Active Failure Modes, Using Dynamic Fault Trees," IEEE Transactions on Reliability, Jun. 2002, 51(2), pp. 240-251.

Muller, "Advanced Drawing Tools Aid Network Planning", International Journal of Network Management, 1997, 7, 324-333.

NFPA, Exhibitor Showcase, 2005 WSCE, May/Jun. 2005, 28 pages.

Ribot et al., "Development Life-Cycle WITH Reuse", Proceedings of the 1994 ACM Symposium on Applied Computing, 70-76.

Sigma Design, "Arris New User Tutorial", First Edition, Version 8.1, updated Jun. 9, 2004, copyright 2004 Sigma Design LLC, 73 pages.

Sigma Design, "Learning Guide for Arris Version 8.1", updated Mar. 23, 2004, copyright 2000-2004 Sigma Design, 69 pages.

Software Engineering, Inc., "Clients," retrieved on May 16, 2005 from http://www.softwareengineering.com/clients.htm, ©2005, 2 pages.

Software Engineering, Inc.; Clients; retrieved on May 16, 2005 from http://www.softwareengineering.com/clients.htm; 2 pages.

Sprinkler Design CAD Package, archive of alt.engineering.fire-protection, DesignFire news group, retrieved from http://groups.google.com/alt.engineering.fire-protection/tree/ on Feb. 3, 2006, 1 page.

Tsent, K.C. et al. "A Web-based integrated design system: Its applications on conceptual design 4 stage", The International Journal of Advanced Manufacturing Technology, 2008, 35(9-10), 1028-1040 (Published online Nov. 22, 2006).

USPTO Trademark Search System; search for "autosprink" and status report; retrieved on May 16, 2005 from www.uspto.gov, 5 pages.

Wellman et al., "Sprinkler Systems in Electrical Control Rooms: Cause for Anxiety or Responsible Safety Design?", IEEE Transactions on Industry Applications, Jan./Feb. 1996, 32(1), pp. 25-30.

\* cited by examiner

SYSTEMS AND METHODS FOR IDENTIFYING CRASH SOURCES IN A CAD ENVIRONMENT

RELATED APPLICATIONS

This application: (i) claims priority from U.S. Provisional Patent Application No. 61/157,460, filed Mar. 4, 2009 and entitled "Methods and Apparatuses for Identifying a Host Drawing from Among a Set of CAD Drawings"; (ii) is a continuation-in-part of U.S. patent application Ser. No. 12/150,845, filed May 1, 2008; (iii) is a continuation-in-part of U.S. patent application Ser. No. 12/150,792, filed May 1, 2008, which claims priority from U.S. Provisional Patent Application No. 60/915,198, filed May 1, 2007; and (iv) is a continuation-in-part of U.S. application Ser. No. 12/598,418, filed Oct. 30, 2009, which is a U.S. national stage application under 35 U.S.C. §371 of International Application No. PCT/US08/05602, filed May 1, 2008, which claims benefit of priority from U.S. Provisional Patent Application No. 60/915,195, filed May 1, 2007, each of which is hereby incorporated herein by reference in its entirety to be considered part of this specification.

The present application is also related to U.S. patent application Ser. No. 12/716,757, entitled "Systems and Methods for Differentiating and Associating Multiple Drawings in a CAD Environment"; filed on Mar. 3, 2010, and which is hereby incorporated herein by reference in its entirety.

BACKGROUND

1. Field

Embodiments of the invention are directed to computer aided design (CAD) and, in particular, to systems and methods for managing the processing of multiple CAD drawings.

2. Description of the Related Art

CAD software is often used by designers, architects, engineers and the like, to prepare two-dimensional (2D) CAD drawing(s) or three-dimensional (3D) model(s) representing different physical objects, such as mechanical devices, bridges, buildings, automobiles, airplanes and the like. Oftentimes, the more complex the object, the more complicated the drawings tend to be that illustrate the particular object. For example, with respect to a building, a CAD drawing can include details on the structural components of the building, such as the beams, columns, walls, floors, windows, doors and the like ("frame").

Most CAD designs are generated as a result of collaborative and iterative processes between multiple designers. For example, with respect to a building, after the frame is designed by the architects and structural engineers to create a base CAD drawing of the building structure, that base drawing is then sent to other designers and/or subcontractors to add their components to the design, such as HVAC ducting, plumbing layouts, electrical chases, fire sprinkler lines and the like.

During the design process, the various designers have multiple options for creating CAD designs for their specific portion(s) of the project. In the simplest case, all the designers can utilize the same CAD program used to create the base drawing. However, in many instances, designers utilize third-party programs that are specific to their particular field, which requires exporting data from the base drawing to the third-party program, creating the design using the third-party program and importing the data from the third-party program back into the base drawing.

Alternatively, certain designers utilize a stand-alone product with its own 3D intelligent design engine, such as the AUTOSPRINK program offered by M.E.P. CAD, Inc. (Las Vegas, Nev.), to both create the base drawings and add subcontractor designs, such as with fire sprinkler systems.

With multiple designers participating in the design and review processes on various versions of the CAD drawings for a particular object, a number of problems can arise with respect to managing modifications, identifying and/or resolving conflicts, the reconciliation of 2D and 3D drawings, coordinating associations between related drawings and the like. For example, in the process of adding M.E.P. ("mechanical, electrical, and plumbing") trade designs to a base building or structural drawing, it is common for conflicts to arise between different objects within that drawing (e.g., objects that share the same physical space). Moreover, oftentimes when one object is moved or revised to address a particular conflict, another conflict may be created.

Furthermore, to expedite the design of subcontracted components for a particular project, different subcontractors often work on their modifications to a building design in parallel with one another. These parallel modified CAD drawings are then combined to create a complete design. While faster in some ways, this parallel process can create conflict problems, especially for large drawings. Furthermore, even though a subcontractor may only be responsible for a handful of conflicts, that subcontractor would typically be sent the entire drawing with all the different subcontractor conflicts along with a video and/or a conflict report, and be expected to find their conflicts and resolve them. As a result, a first conflict resolution meeting or design review will often be followed by several additional conflict resolution meetings as the correction of one set of conflicts can generate other problems. Hence, extensive time and resources are often expended to identify and correct conflicts with CAD drawings.

Moreover, when sets of drawings are sent from one party to another (e.g., an architect to a general contractor), the drawings can become disassociated or detached from one another. These changes can require substantial time and resources on the part of the receiving party to reload each drawing into a CAD program and attempt to visually re-associate each of the drawings to avoid broken references and/or other errors.

SUMMARY

In view of the foregoing, a need exists for improved systems and methods for facilitating CAD design. For instance, there is a need for systems and methods that assist a user in automatically classifying and/or associating drawings contained in a large set of drawings, especially when the user is not provided with readily available information as to the relationships between the drawings. Moreover, a need exists for inventive crash-resistant systems and methods that facilitate processing of multiple drawings, such as during a binding and/or batch compare process, and/or that identify potential crash sources.

Certain embodiments of the invention automatically re-associate host drawing files with their referenced files. For instance, when drawing files become disassociated from their parent directory or drive as they are transferred between parties, the receiving party rarely knows which drawings represent host drawings and which represent external reference drawings. Inventive systems and methods disclosed herein comprise a host manager module that automatically classifies received drawings and establishes and/or identifies associations between the drawings, thereby resulting in a substantial savings in time and resources on the part of the receiving party.

Certain embodiments of the invention also advantageously provide for systems and methods that automatically identify the causes of errors during one or more CAD routines or processes, such as while binding X-refs to a host drawing and/or batch comparing multiple drawings. For example, multiple instances or sessions of a CAD program can be used to track potential crash occurrences during a particular process and dynamically replace corrupt drawings or broken references with dummy or proxy drawings so that the desired process can continue to completion.

In certain embodiments, a method is disclosed for managing a batch of CAD drawings. The method comprises receiving with a first computing device a plurality of CAD drawings associated with a design of one or more structures, wherein the plurality of CAD drawings comprises at least one host drawing and a plurality of external reference drawings. The method further comprises storing a list of the plurality of CAD drawings in a memory and, for each of the plurality of CAD drawings, accessing an external reference listing within the CAD drawing to identify one or more external reference drawings related to the particular CAD drawing. If the listing identifies no external reference drawings, the method stores an identification of the particular CAD drawing within a first database. Otherwise, the method stores an identification of each of the one or more external reference drawings within a second database. The method further comprises identifying as external reference drawings, with a host manager module executing on the first computing device, first ones of the plurality of CAD drawings identified in the second database and storing the external reference drawings in a first location; identifying as stand-alone drawings, with the host manager module, second ones of the plurality of CAD drawings identified in the first database and storing the stand-alone drawings in a second location; and identifying as host drawings, with the host manager module, third ones of the plurality of CAD drawings not identified in the first or second databases and storing the host drawings in a third location. Moreover, the method can optionally include outputting to a user interface an indication of the external reference drawings, the stand-alone drawings and the host drawings.

Certain embodiments of the invention include a system for managing a batch of CAD drawings. The system includes a plurality of CAD drawings comprising at least one host drawing and a plurality of external reference drawings; a storage device configured to store the CAD drawings and a list of each of the plurality of CAD drawings; a first database; and a second database. The system further includes a host manager module configured to, for each of the plurality of CAD drawings: access a listing of the CAD drawing to identify any external reference drawings associated with the particular CAD drawing, and store an identification of the particular CAD drawing in the first database if the listing identifies no external reference drawings. If the listing identifies external reference drawing(s), the host manager module stores an identification of each of external reference drawings within the second database. The host manager module is further configured to: identify first ones of the CAD drawings identified in the second database as external reference drawings and store the external reference drawings in a first memory location; identify second ones of the CAD drawings identified in the first database as stand-alone drawings and store the stand-alone drawings in a second memory location; and identify third ones of the CAD drawings not identified in at least one of the first database and the second database as host drawings and store the host drawings in a third memory location.

Certain embodiments of the invention provide a system for selectively grouping a batch of CAD drawings. The system comprises means for receiving a plurality of CAD drawings comprising at least one host drawing and a plurality of external reference drawings and means for storing a list of the plurality of CAD drawings. The system further include means for processing each of the plurality of CAD drawings by accessing a listing of the CAD drawing structured to identify one or more external reference drawings related to the particular CAD drawing. If the listing identifies no external reference drawings, the processing means stores an identification of the particular CAD drawing within a first database. Otherwise, the processing means stores an identification of each of the one or more external reference drawings within a second database. The processing means further stores first ones of the plurality of CAD drawings identified in the second database in a first location, second ones of the plurality of CAD drawings identified in the first database in a second location, and third ones of the plurality of CAD drawings not identified in the first or second databases in a third location. The system can also optionally include means for displaying relationships between at least a portion of the CAD drawings stored in the first and third locations.

In other embodiments, a method is disclosed for processing a batch of CAD drawings. The method comprises opening a first session of a CAD application; storing an identification of a first CAD drawing in a first data structure; and initiating a second session of the CAD application to process the first CAD drawing, wherein the first CAD drawing comprises a plurality of references to a plurality of external drawings associated with the first CAD drawing. The method also includes processing the references to the plurality of external drawings of the first CAD drawing, wherein said processing comprises: selecting one of the references, storing in the first data structure an identification of the external drawing corresponding to the selected reference, and attempting with the second session to link (e.g., bind) the corresponding external drawing to the first CAD drawing. The method further includes monitoring with the first session said attempting to link by the second session and, when said attempt is successful, clearing the first data structure of at least the identification of the external drawing corresponding to the selected reference and continuing to process, with the second session, another one of the plurality of references if all the plurality of references have not been processed. When said attempt by the first session is not successful, the method includes storing in a second data structure, with the first session, the identification of the first CAD drawing and the identification of the external drawing corresponding to the selected reference, and closing the second session of the CAD application.

Certain embodiments of the invention include a system for processing a batch of CAD drawings. The system comprises at least one storage device configured to store a plurality of CAD drawings; a first instance of a CAD application executing on at least one computing device; and a first data structure configured to store an identification of a first one of the plurality of CAD drawings, wherein the first CAD drawing comprises references to a plurality of external drawings associated with the first CAD drawing. The system further includes a second instance of the CAD application initiated by the first instance of the CAD application to process the first CAD drawing by attempting to individually link (e.g., bind) each of the referenced external drawings to the first CAD drawing, wherein the second instance of the CAD application is further configured to: store in the first data structure an identification of each referenced external drawing to be linked prior to attempting to individually link the referenced external drawing, and remove from the first data structure the identification of the referenced external drawing after successfully linking the referenced external drawing to the first CAD drawing. Moreover, the first instance of the CAD application is further configured to monitor the second instance of the CAD application to detect an error event during said processing of the first CAD drawing by the second instance of the CAD application that interrupts said processing by the second instance of the CAD application and, upon detection of the error event, store to a second data structure the identification of the referenced external drawing stored in the first data structure at the time the error event was detected.

Certain embodiments of the invention include a system for processing a batch of CAD drawings. The system includes means for storing a plurality of CAD drawings to be processed, means for executing a first session of a CAD application, and first means for storing an identification of a first CAD drawing of the plurality of CAD drawings, wherein the first CAD drawing comprises references to a plurality of external drawings associated with the first CAD drawing. The system further comprises means for initiating a second session of the CAD application to process each of the references to the plurality of external drawings, wherein said processing comprises: selecting one of the references, storing in said first storing means an identification of the external drawing corresponding to the selected reference, and attempting to link (e.g., bind) the corresponding external drawing to the first CAD drawing. If said attempt is successful, the first storing means is cleared of at least the identification of the external drawing corresponding to the selected reference and another one of the references is selected for processing if all the references have not been processed. If said attempt to link by the first session is not successful, the first session stores in a second means for storing the identification of the first CAD drawing and the identification of the external drawing corresponding to the selected reference, and the second session is closed by the first session.

Certain embodiments of the invention provide a method for processing a batch of drawings. The method comprises processing one or more drawings from the batch of drawings until a problematic data structure having a location in a drawing among the one or more drawings is encountered that would cause said processing to crash if not averted. The method further comprises stopping or interrupting said processing, creating a proxy for the problematic data structure and inserting the proxy into the drawing at the specified location in place of the problematic data structure. The method further includes creating an entry in a log stored in a memory including information related to the problematic data structure, including said location, restarting said processing at a restart point, and repeating each of the preceding acts until said processing of the batch of drawings has completed.

Moreover, in certain embodiments, the above processing comprises at least one of: a comparison process between a first set of drawings and a second set of drawings among the batch of drawings, a clean-up process wherein one or more drawings in the batch of drawings are processed in a manner similar to a base drawing to create one or more cleaned-up drawings, and a comparison process between the one or more cleaned-up drawings and one or more other drawings within the batch of drawings.

In certain embodiments, a method is provided for cleaning up a batch of drawings, each including a first plurality of data structures. The method comprises recording a series of functions activated by a user to clean up a second plurality of data structures in a base drawing; performing the series of functions on the first plurality of data structures in each drawing until a problematic data structure having a location in a drawing in the batch of drawings is encountered that would cause said performing to crash if not averted; stopping said performing; creating a proxy for the problematic data structure; inserting the proxy into the drawing at the location in place of the problematic data structure; creating an entry in a log stored in a memory including information related to the problematic data structure, including the location; restarting said performing at a restart point; and repeating said performing to said restarting until said performing has been completed for each drawing in the batch of drawings to create a set of cleaned-up drawings.

Certain embodiments of the invention further utilize at method comprising: comparing a plurality of data structures in at least a first cleaned-up drawing among the set of cleaned-up drawings to a plurality of data structures in at least a second cleaned-up drawing until a problematic cleaned-up data structure having a cleaned-up drawing location in either the first cleaned-up drawing or the second cleaned-up drawing is encountered that would cause said comparing to crash if not averted; stopping said comparing; creating a proxy for the problematic cleaned-up data structure; inserting the proxy into the first cleaned-up drawing or the second cleaned-up drawing at the cleaned-up drawing location in place of the problematic cleaned-up data structure; creating an cleaned-up drawing entry in a cleaned-up drawing log stored in the memory including information related to the problematic cleaned-up data structure, including the cleaned-up drawing location; restarting said comparing at a restart point; and repeating each of the preceding acts until said comparing of the batch of drawings has completed.

A further embodiment of the invention provides a method for comparing at least a first drawing in a batch of drawings to at least a second drawing in the batch of drawings, each drawing in the batch of drawings including a plurality of data structures. The method includes: comparing the plurality of data structures in the first drawing to the plurality of data structures in the second drawing until a problematic data structure having a location in either the first drawing or the second drawing is encountered that would cause said comparing to crash if not averted; stopping said comparing; creating a proxy for the problematic data structure; inserting the proxy into the first drawing or the second drawing at the location in place of the problematic data structure; creating an entry in a log stored in a memory including information related to the problematic data structure, including the location; restarting said comparing at a restart point; and repeating each of the preceding acts until said comparing of the batch of drawings has completed.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF THE PREFERRED EMBODIMENTS

Figure 1:
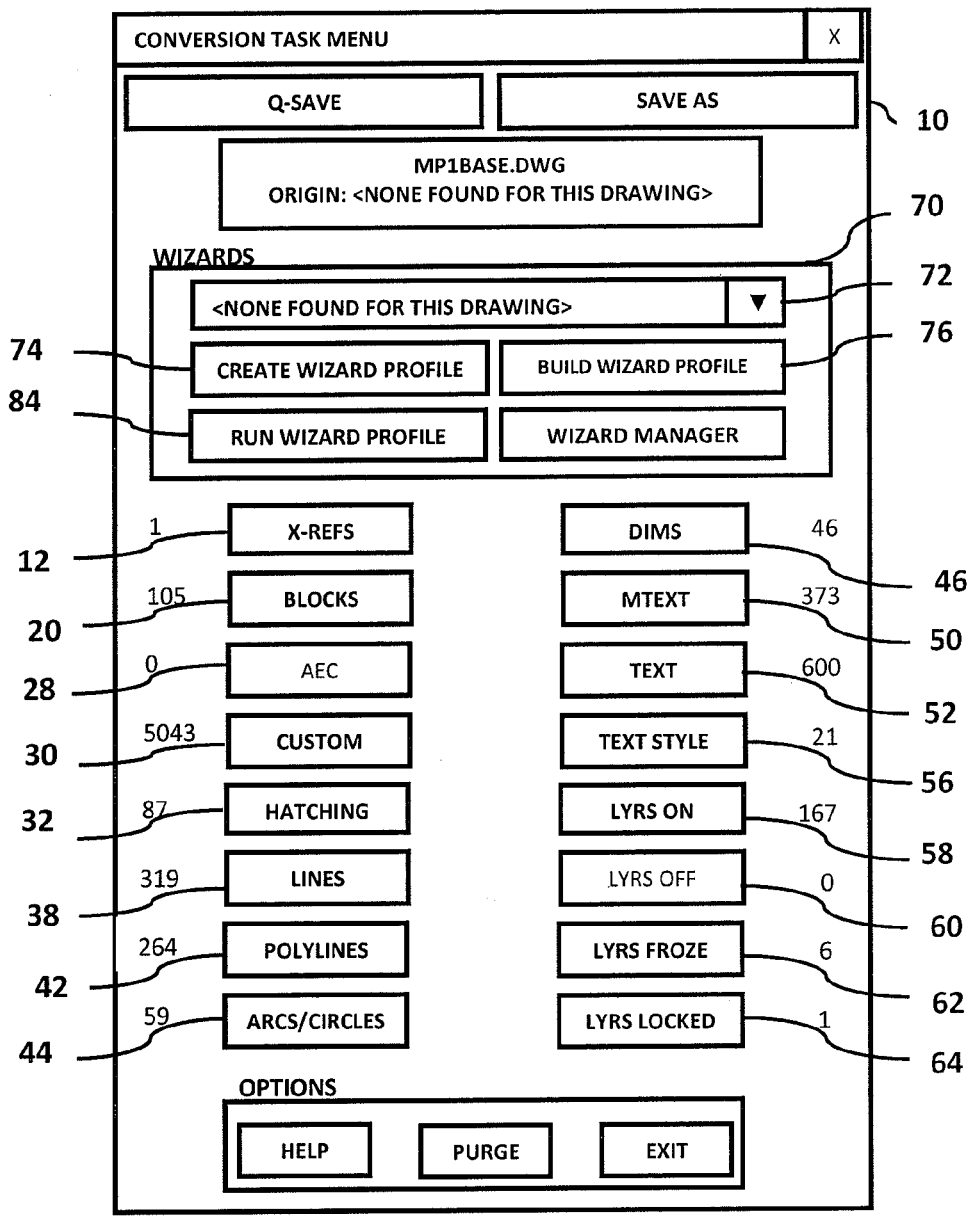
FIG. 1 illustrates an example dialog box for a clean-up utility, in accordance with certain embodiments of the invention.

The features of the systems and methods will now be described with reference to the drawings summarized above.

Throughout the drawings, reference numbers are re-used to indicate correspondence between referenced elements. The drawings, associated descriptions, and specific implementation are provided to illustrate embodiments of the invention and not to limit the scope of the disclosure.

In addition, methods and functions described herein are not limited to any particular sequence, and the blocks or states relating thereto can be performed in other sequences that are appropriate. For example, described blocks or states may be performed in an order other than that specifically disclosed, or multiple blocks or states may be combined into a single block or state.

Where this specification refers to the system's characteristics described herein, note that the same description applies to related methods, apparatus, and computer programs. In certain embodiments, the invention comprises a software program written in AutoLISP and operates in a stand-alone fashion or in conjunction with the AUTOCAD platform by Autodesk, Inc. (San Rafael, Calif.), on any appropriate computer system or device. For instance, as utilized in conjunction with AUTOCAD, certain embodiments of the invention, once installed, are incorporated into the standard menu bar for the AUTOCAD program so that one or more features and/or functions disclosed herein are readily accessible within the AUTOCAD system.

It will be appreciated, however, that embodiments of the invention are not limited to the AUTOCAD platform and can be utilized in conjunction with other CAD programs, such as, for example, REVIT, VISIO, MICROSTATION, ARCHICAD, BRICSNET, TURBOCAD, INTELLICAD, CATIA or the like. Moreover, in other configurations, embodiments of the invention can comprise one or more modules written in VisualBasic, C, C++, Java, Python, combinations of the same or the like. Furthermore, although certain embodiments of the invention are described in the context of building design projects, other embodiments of the invention can be used with the design of other projects, such as, for example, roads, bridges, buildings, automobiles, aircraft, combinations of the same or the like, and/or with other CAD media, such as art, science, graphics combinations of the same or the like.

The term "object" as used herein is a broad term and is used in its ordinary sense and refers to, without limitation, a fundamental unit for creating a CAD drawing. For instance, objects can comprise graphic objects, such as a line, arc, circle, any 2D or 3D entity, text, combinations of the same or the like. Objects can also comprise non-graphic objects, such as attributes, building information modeling (BIM) data, metadata, extensions, combinations of the same or the like.

The term "block" as used herein is a broad term and is used in its ordinary sense and refers to, without limitation, any internal database assembly and/or collection of one or more graphic objects and/or non-graphic objects in an independent unit.

The term "drawing" as used herein with respect to CAD drawings is a broad term and is used in its ordinary sense and refers to, without limitation, any collection of one or more blocks that make up at least a portion of a design of a structure, article, vehicle, item, combinations of the same or the like.

The term "external reference," or "X-ref," as used herein is a broad term and is used in its ordinary sense and refers to, without limitation, a file, drawing, design or other data structure that comprises an assembly of one or more objects referenced by another drawing. For example, an X-ref may not be directly accessible or editable to the user of the referencing (e.g., host) CAD drawing until the X-ref is inserted or bound into the drawing (e.g., thereby becoming a block of the CAD drawing).

The term "entity" as used herein is a broad term and is used in its ordinary sense and refers to, without limitation, any drawing, block, object or other distinct, individual unit usable in CAD design.

Moreover, as further described herein, several of the accompanying drawings comprise illustrations of exemplary screen displays (e.g., dialog boxes) that can be used with embodiments of the invention to perform many of the disclosed methods and processes. Thus, it should be understood that such screen displays provide a means for executing and/or initiating accompanying methods and/or processes and that the appropriate modules, which correspond to the particular process or method, can function based on input received through the screen display(s).

FIG. 1 is a screen shot representing a main dialog box 10, which provides a user interface for performing high-level tasks for certain embodiments of the invention. As illustrated, the main dialog box 10 comprises a number of selectable buttons for accessing or performing various functions described in more detail herein. It will be appreciated that these buttons and functions described below are for illustrative purposes and that other embodiments of the invention can include a main dialog box 10 with more or fewer buttons than what is shown in FIG. 1. Moreover, although the dialog box 10, and other interfaces described herein, are described as having "buttons," it will be appreciated that other interface means can be used for obtaining input from a user, such as, for example, drop-down lists, checkboxes, text boxes, combinations of the same or the like.

With reference to dialog box 10, the "Q-Save" and "Save As" buttons allow a user to perform a quick save of an open CAD drawing, or to save that drawing under a different name/location, respectively. In some cases, the buttons have a number written to either their left or right side. In certain embodiments, when that number is "0," the button is inactive and the text written on the button is only lightly visible. When the number is greater than "0," the button is active and the text written on the button is darkened. Irrespective of whether a button illustrated in FIG. 1 or any of the drawings is active or inactive, the present description will treat the button as active and discuss the functions and attributes associated with the buttons.

Clean-up tasks can be performed starting with the wizard function, illustrated in the upper one-third of FIG. 1, and then by selecting the tasks represented by the buttons listed below the wizard function. In certain embodiments, these buttons are advantageously arranged in an order that the user can use them to resolve all entities in the drawings. For example, in certain embodiments, "X-refs" should be advantageously resolved first. Thus, the top button in the left column of buttons in FIG. 1 is the X-refs button 12.

Once the X-refs are converted to blocks by inserting or binding the X-refs into the current drawing, the blocks can then be expanded or "exploded." In certain embodiments, to expand a block means to explode that block within the current drawing to reveal the constituent parts and/or attributes of the block. In certain situations, it can be necessary to expand a block in order to obtain a more complete understanding of what is included in that block and/or to make use of information included in the block.

The user can continue in this fashion, moving from button to button to the bottom of the left column. Once all the tasks represented by the buttons in the left column have been completed, the user can then move to the buttons at the top of the right column and proceed downward. In certain embodiments, the "Help," "Purge" (e.g., to remove an item from the database that has already been removed from a drawing) and "Exit" functions activated by the buttons at the bottom of the dialog box 10 can be performed at any time. For instance, the Exit function exits the current utility or function and returns the user to the main system.

As noted above, since X-refs are not usually manageable by the current drawing (e.g., the drawing being resolved), the X-refs must first be inserted into the drawing in order for the objects in the X-refs to become manageable (i.e., gripped and/or edited) within the parent drawing. Such can be accomplished through the X-ref utility of certain embodiments of the invention. In certain embodiments; the X-ref utility either inserts the X-ref as a block into the current drawing or deletes the X-ref. When an X-ref is converted to a block, the elements or objects of the X-ref belong to the block, which belongs to the current drawing, and can be manipulated within the current drawing.

As illustrated in FIG. 1, there is one (1) X-ref in the associated CAD drawing, as reflected by the "1" next to the X-refs utility button 12. In certain embodiments, this X-ref must be resolved before the user can continue the cleaning and/or reduction process. In certain embodiments, when the "X-refs" utility button 12 is selected, the X-refs are gathered and sorted as to their hierarchy and availability.

In certain circumstances, some X-refs may not be available (e.g., missing or detached), even though a reference to the X-ref exists in the drawing and may result in a larger number of X-refs being reported in FIG. 1. If an X-ref is not available, it must still be fixed in the X-ref utility, as further described below, in order to reduce the X-refs listed in FIG. 1 to zero.

Figure 2:
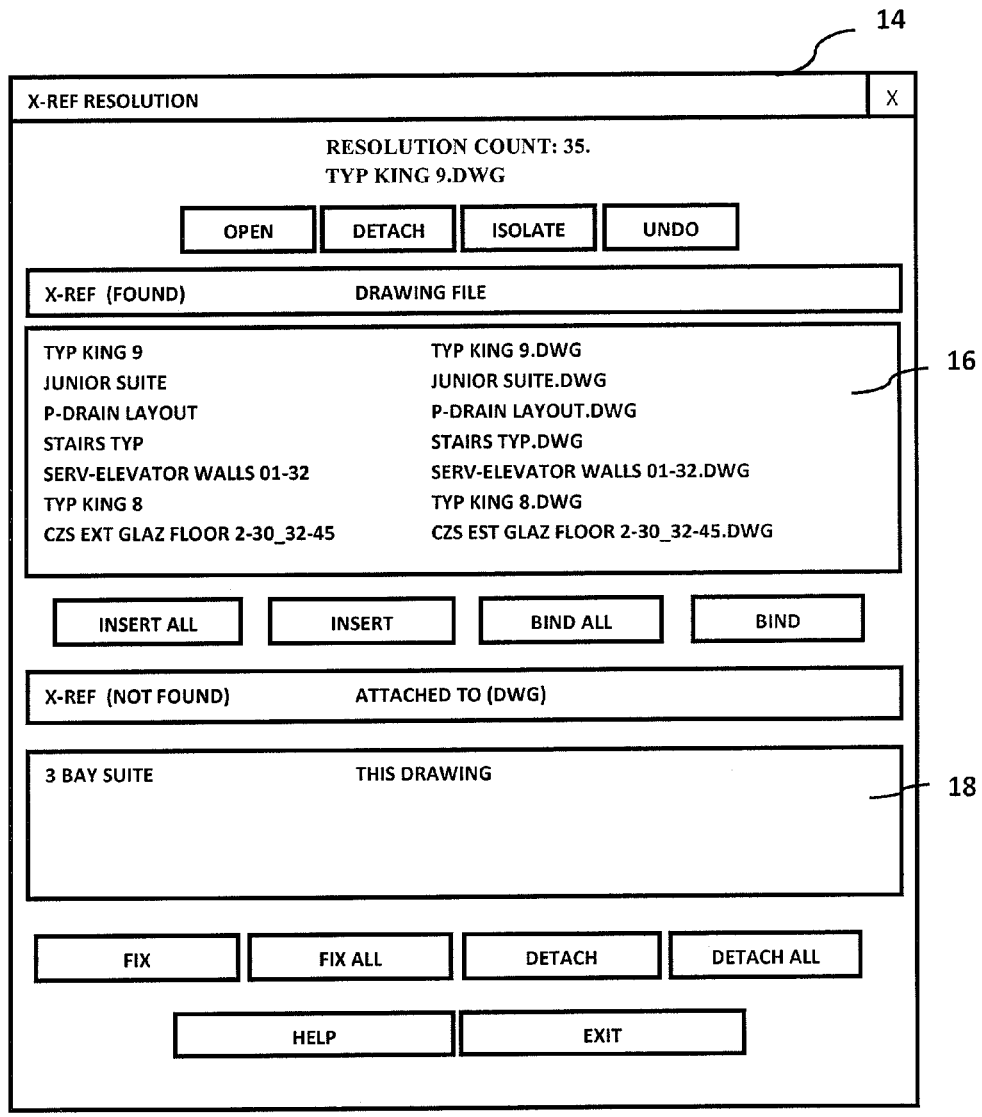
FIG. 2 illustrates an example external reference resolution dialog box, in accordance with certain embodiments of the invention.

FIG. 2 is an exemplary screen shot of an X-ref resolution dialog box 14 of the X-ref utility, according to certain embodiments of the invention. In certain embodiments, each of the X-refs attached to the current drawing that exists in the specified search path, is listed in a top pane 16. In certain embodiments, the X-refs listed in the top pane 16 can include stand-alone X-refs and nested X-refs (e.g., X-refs with other X-refs attached). However, in certain embodiments, the top pane 16 does not draw any distinction between stand-alone X-refs and nested X-refs because both can be found and the characteristics of the X-refs can be determined.

Bottom pane 18 lists X-refs that are attached to the current drawing but either cannot be found in the specified search path and/or do not exist. If the X-ref is a stand-alone X-ref, then the bottom pane 18 indicates that it is attached to "This Drawing." If the X-ref is nested, then the bottom pane 18 provides the search path for that X-ref.

In certain embodiments, the first X-refs listed in the top pane 16 and bottom pane 18 are highlighted to signify that they will be the first X-refs in either pane to be processed by default. In certain embodiments, the user can select other X-refs for processing instead by, for example, mouse clicking on a desired X-ref in the panes of the dialog box 14. The buttons listed above and immediately below top pane 16 give the user various processing options for any X-refs in the top pane 16 and any X-refs in the bottom pane 18 that include nested X-refs.

For example, the "Open" function opens the selected X-ref in another editor. This enables the user to look at what is in the file, to detach X-refs that are attached to the selected X-ref, to delete the file, combinations of the same or the like. The "Detach" button allows the user to remove the selected X-ref from the current drawing. The "Isolate" button allows the user to turn off all the layers associated with all other X-refs in the current drawing, except those layers associated with the selected X-ref. This allows the user to view the elements (objects) associated with only the selected X-ref.

The "Undo" function undoes an action that changes the database of the current drawing. In certain embodiments, the undo feature is only effective at undoing "Detach," "Insert," "Insert All," "Bind" and "Bind All" commands. The "Undo" function further serves to erase the memory of the wizard function (to be described in detail below), which can record specific actions taken by a user for later use.

The "Insert" function inserts the selected X-ref into the drawing, thus changing the X-ref, which cannot be directly managed, into a block that can be managed. The "Insert All" button can activate a similar function for all the X-refs. The "Bind" button is used to bind a selected X-ref into the drawing, thereby changing the X-ref into a block. The "Bind All" button triggers the same binding function for all X-refs.

Although the Insert and Bind functions appear to perform similar processes, there is at least one difference in the way an X-ref is handled from one function to the other. When an X-ref is inserted into a drawing, any blocks or layers in the drawing that are in the X-ref are appended to the table for the corresponding block that is created. When binding an X-ref to the drawing, the table objects (e.g., layers, blocks, etc.) that are found in the X-ref are preceded with a field name of the X-ref. For example, if there is a layer named "WALLS" in an X-ref named "XYZ" and the Bind function is used, the layer would be named "XYZ$0$WALLS." If the Insert function is used, the layer's name would remain "WALLS."

In certain embodiments, the buttons immediately under the bottom pane 18 are used to address unfound X-refs. The "Fix" function removes all references that do not exist from the selected X-ref, relative to the current drawing, but does not remove the X-ref itself. The "Fix All" button activates the same function all missing X-refs. In certain embodiments, the Fix and Fix All functions do not insert the missing X-refs into the drawing and do not repair the missing X-refs. Rather, they attempt to re-attach the X-ref in some manner so it can then be detached from the current drawing. The "Detach" function removes the selected missing X-ref completely from the current drawing, and "Detach All" performs the same function for all missing X-refs. In certain embodiments, all four command functions can be quickly used to resolve all missing X-refs to zero.

Once all the X-refs have been resolved, the user continues resolving the blocks by selecting the "Blocks" button 20 in FIG. 1. When the Block button 20 is selected, the program gathers and sorts the blocks based on their hierarchy and availability, including all the blocks in the parent drawing and nested in other blocks.

Figure 3:
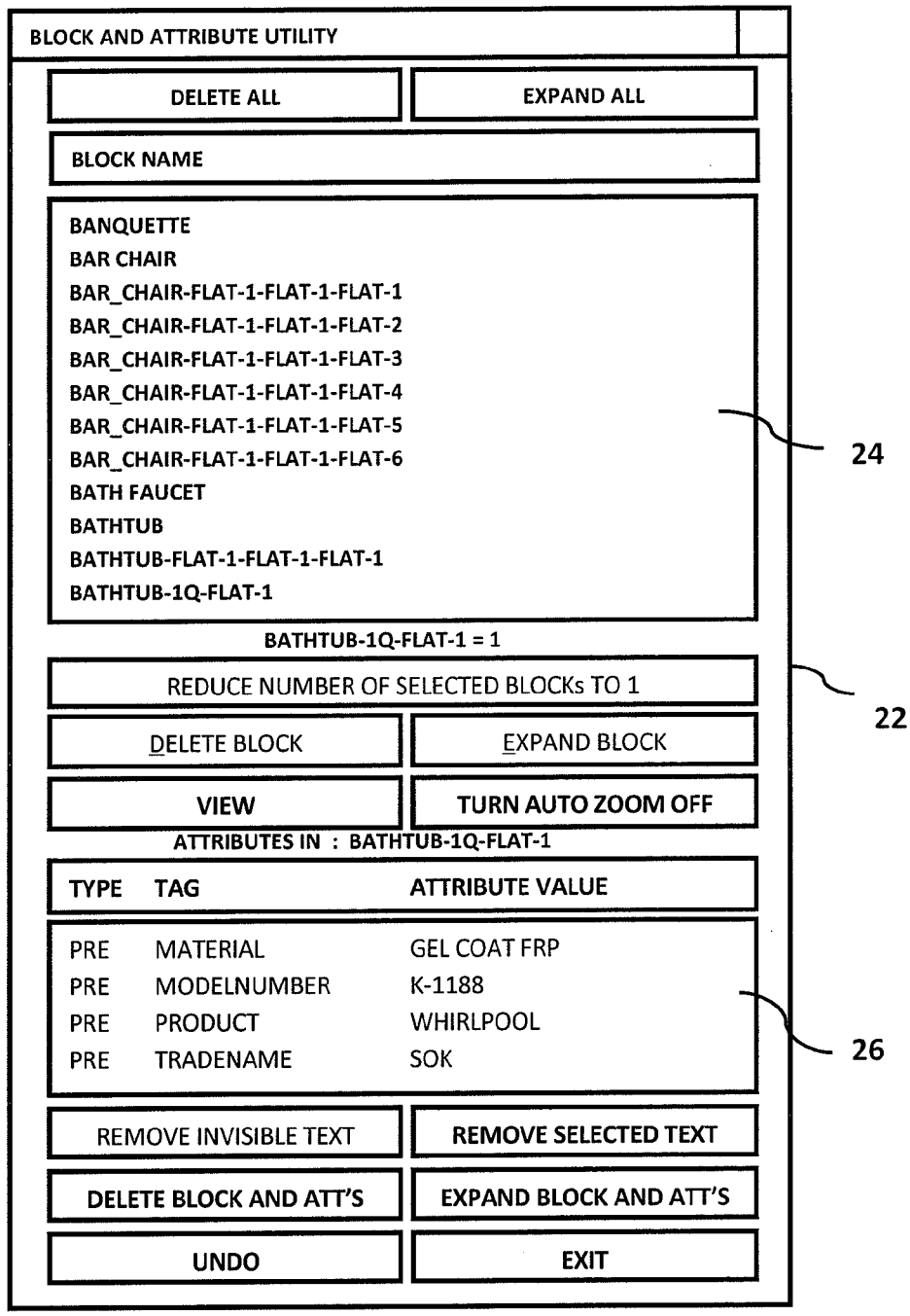
FIG. 3 illustrates an example dialog box for a block and attribute utility, in accordance with certain embodiments of the invention.

Once the blocks have been gathered, they are sorted alphabetically and listed in dialog box 22 of the Block and Attribute Utility illustrated in FIG. 3. In certain embodiments, Block Name pane 24 displays the blocks in the current drawing, with nested blocks proceeded by ">>" immediately following the parent block. For instance, as many as eight to ten or more nested blocks can be listed under a parent block. In certain embodiments of the invention, all blocks are intelligently handled to ensure that elements related to a block are placed on the element layer of that block and not the parent block layer or layer -0- when the blocks are expanded.

Attributes pane 26 lists the attributes associated with a selected block in the block pane 24. In general, attributes comprise one or more fields, such as metadata, associated with a block or part of a block. An attribute that contains one field of displayable information typically has three subfields: a tag; a prompt; and a value. The tag is the name of the field. The prompt is the text displayed at the AUTOCAD command line, which directs or prompts the AUTOCAD user to specify information pertaining to the block. The attribute value provides additional detail for the tag.

When the "Explode" command is utilized on a block within AUTOCAD, the AUTOCAD program does not usually place all the elements in that block on the proper layer. As a result, attributes associated with that block can be lost. Likewise, using the AUTOCAD "Explode" command on an attribute typically leaves the user with only the name of the field in the attribute. For example, an attribute with a tag of "ROOMNO" becomes exactly "ROOMNO," and any other information, such as a value, in the subfields is lost. Thus, if a block named "ROOMID" is inserted throughout the drawing with tag information of "ROOMNO" and values of "RM#2111" and "RM#2112," the values can be lost and simply become "ROOMNO."

In certain embodiments, the buttons listed above the Block Name pane 24 pertain to the blocks in the Block Name pane 24. Since any action taken on a block can affect the attributes of that block, if a block selected in the Block Name pane 24 has attributes, the "Delete All" and "Expand All" buttons can disabled, which forces the user to process the attributes in the Attributes pane 26 and/or to make proper decisions about the available information associated with the attributes. Once the attributes are processed, the block buttons are re-enabled.

The middle grouping of buttons, between the Block Name pane 24 and the Attributes pane 26, apply to the blocks listed in the Block Name pane 24. The "Reduce Number of Selected Blocks to 1" function deletes all the selected blocks except for one of the selected blocks, and only if the blocks selected have multiple insertions with all the same parameters. This function is useful when a number of blocks share identical information and exploding all of those blocks would result in the duplication of that identical information within the current drawing by the number of blocks (e.g., each identical object stacked on top of each other identical object). This way, one block is kept with the necessary information, and the rest are deleted.

The "Delete Block" function deletes the selected block. The "Expand Block" function expands or explodes the selected block. In certain embodiments, if the selected block has attributes, the Delete Block and/or Expand Blocks button are disabled until the attributes are processed. The "View" button is used to write the block to a phantom name in storage and then to open the block in a new editor so the user can view the contents of the block before expanding or deleting the block (e.g., a preview function). When viewing a block, the system is set by default to automatically zoom to the location of the block within the drawing, versus requiring the user to manually search for and locate the block. The "Turn Auto-Zoom On/Off" button allows the user to toggle the auto zoom feature on or off before using the view function.

The buttons under the Attributes pane 26 apply to the attributes. If a block in the Block Name pane 24 is highlighted and that block contains attributes, those attributes can be listed in Attributes pane 26. For example, the block "Bathtub-1q-flat-1," which corresponds to a bathtub, selected in the Block Name pane 24 contains a number of attributes that are listed in the Attributes pane 26. These attributes contain information about the material used to make the bathtub, its model number, the manufacture of the bathtub and its trade name. The attributes also include a type indicator, such as if the attribute text is preset (PRE), needs to be verified (VER), is a constant (CON) or is invisible (INV).

The "Remove Invisible Text" button allows a user to delete attributes having an invisible type of text. In certain embodiments, invisible text is text that is only displayed under certain conditions, but is otherwise displayed as empty boxes or rectangles. For instance, text may be designated as "invisible" based on a particular bit value in the text's attributes.

In certain embodiments, it can be very time consuming to isolate and delete invisible text using a CAD drawing program, especially when working with hundred of drawings. In view of these drawbacks, certain embodiments of the present invention enable invisible text to be easily deleted, such as when the user knows that the invisible text will not be needed for his or her purposes. However, as certain other embodiments of the invention can utilize invisible text when automating the conversion of 2D beams and columns into 3D beams and columns, great care should be exercised when using the remove invisible text function.

The "Remove Selected Text" function removes the value of text from the selected attribute. When a block corresponding to the selected attribute is expanded, the text contained in the removed value will be blank. For example, the plumbing contractor may not need to keep information about the material used to make the tub and its product and trade name. Rather, the model number may be sufficient. In such a case, the user may want to remove all the text except for the model number. Since different block/attribute information can be important to different users, the "Delete Block and Att's" button enables the entire block and corresponding attributes or other associated information to be deleted, while the "Expand Block and Att's" button allows the block and all information in the corresponding attributes to be expanded into the current drawing.

Referring back to FIG. 1, "AEC" button 28 is active when the drawing being processed contains AEC objects, or proxy objects created by other AutoDESK products, such as Architectural Destktop (ADT). In certain embodiments, these proxy objects are only displayed in a CAD drawing if the extension file (e.g., object enabler) for these objects is loaded. If the required extension file (e.g., an .arx or .dll file) is not loaded, then the basic elements that make up the object are collected under their respective definition buttons (e.g., lines button 38, arcs/circles button 44, etc.) and processed accordingly. If object enablers are loaded, the function of the "AEC" button 28 can break any AEC objects present into blocks, thereby causing the user to return to the Blocks button 20 to further process those objects.

"Custom" button 30 activates a similar function as the AEC button 28. Custom objects are objects defined by non-AUTOCAD drawing systems, such as CAD-Duct, a 3D drafting software package by Micro Application Packages Ltd. (United Kingdom). Custom objects can be typically defined by an extension file such as .arx, .dll or .dbx. In certain embodiments, the custom objects can include complex objects made up of polygon meshes or 3D faces.

For example, a ball can be represented by a polygon mesh by defining the fulcrum point and a radius of the sphere. The smoothness of the ball would depend upon the resolution of the mesh. In certain embodiments, a mesh surface is akin to a window with four panes, whereas a 3D face is akin to a window with a single pane. The shape of any object can be defined by each connection point of each pane by giving each connection point x-, y- and z-coordinates. If custom objects, are present in the drawing, then selecting the Custom button 30 will break the custom objects into blocks for processing. If the object enabler for a custom object is not present, the basic elements forming that object are collected and processed accordingly.

Figure 4:
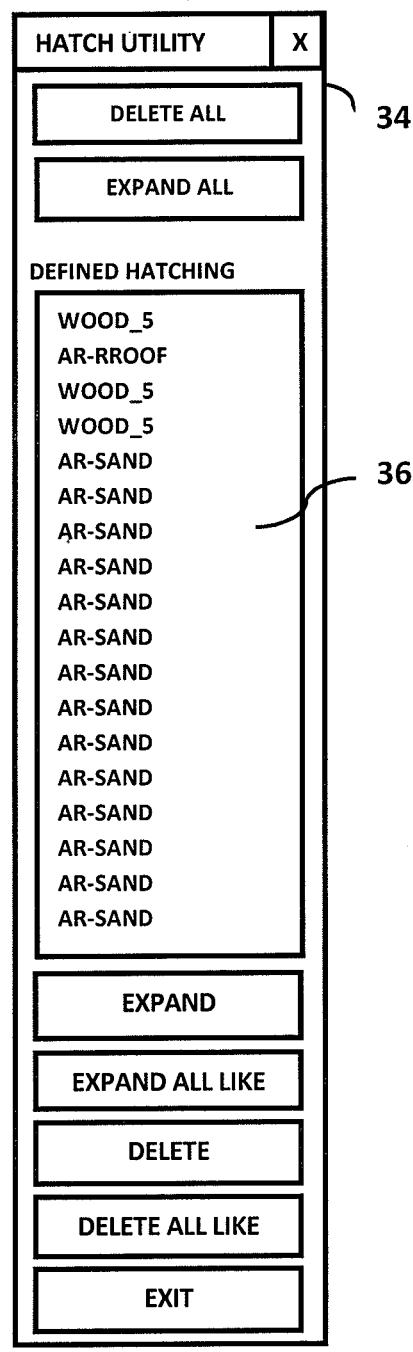
FIG. 4 illustrates an example dialog box for a hatch utility, in accordance with certain embodiments of the invention.

"Hatching" button 32 of the dialog box 10 causes all hatch patterns in the current drawing to be automatically gathered and the Hatch Utility dialog box 34 of FIG. 4 to be opened. In certain embodiments, a hatch is an object that applies patterns to user defined areas, usually defined by enclosed boundaries. As shown in FIG. 4, the Hatch Pane 36 presents the user with a list of the hatches used in the subject drawing. When a hatch pattern within the Hatch pane 36 is selected, such as "WOOD_5," the hatch utility automatically zooms to the selected hatch pattern with the current drawing and/or flashes/highlights the pattern to enable the user to easily discern the hatch from other objects. This can be an important function because hatches are sometimes used for physical objects (e.g., roofing tiles) versus designating the composition of material in an area (e.g., wood, gravel, sand, etc.). Thus, where it may be desirable to delete a hatch related to the composition of materials, it may not be desirable to delete a hatch that defines a physical object.

If the user knows that none of the hatch patterns in the current drawing is needed, the user can select the "Delete All" button at the top of the Hatch Pane 36. In certain embodiments, selecting the "Expand All" button will cause all hatch patterns listed in Hatch Pane 36 to be exploded into the objects the hatch patterns contain, such as lines, circles, arcs and the like. The buttons below the Hatch Pane 36 give the user the ability to expand or delete selected hatch patterns and/or hatch patterns that are the same as the selected hatch pattern. In one embodiment of the invention, each hatch pattern and the coordinates for that pattern in the current drawing are saved for use by the wizard utility to improve the clean-up accuracy of subsequently processed drawings. Also, in certain embodiments, the user can be provided with an additional button (e.g., a "Modify" button) that enables the user to change a selected hatch pattern to a different hatch pattern from a list of available hatch patterns. Thus, rather than delete an odd hatch pattern that was used in the drawing, the user would have the option of modifying or replacing the pattern.

Activation of "Lines" button 38 of the dialog box 10 of FIG. 1 causes the current CAD drawing to be searched for duplicate lines. Duplicate lines are lines that are visually positioned on top of other lines of the same or substantially similar type. For example, duplicate lines are often created when other users have manipulated the drawing or copied or traced various areas of the drawing without cleaning up the extra lines they created. These lines increase the size of the drawing file and can cause problems when subsequent work is performed on the drawing.

Figure 5:
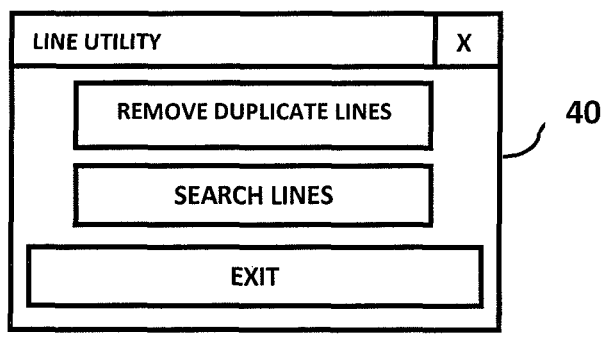
FIG. 5 illustrates an example dialog box for a line utility, in accordance with certain embodiments of the invention.

In certain embodiments, when the Lines button 38 is selected, a Line Utility dialog box 40 (see FIG. 5) appears. As shown, the dialog box 40 presents the user with two primary options; the "Remove Duplicate Lines" button or the "Search Lines" button. If the Remove Duplicate Lines button is selected, the drawing is searched for duplicate lines, and any duplicate lines the system finds are deleted. In certain embodiments, to determine if a line is a duplicate, the system starts by gripping a line and scanning the drawing array for any vectors that are geometrically equal to the gripped line. If such a line is found, it is deleted, and the system moves on to the next line. The Search Lines button operates in a similar fashion, but allows the user to make a line-by-line determination, which can be helpful for finding lines that are not duplicate lines, but are buried behind other lines.

"Polylines" button 42 of the dialog box 10 works in the same fashion as the Lines button 38, in that it can be used to explode or separate polylines into separate segments, which can then either be left in the drawing or deleted. In certain embodiments, a polyline comprises a complex line that is formed of many segments and that can be left open or closed by connecting its end point to its starting point.

"Arcs/Circles" button 44 does not require any further user interaction. Rather, upon selection of the button 44, the drawing is searched for duplicate arcs and circles, and the duplicates are removed. In certain embodiments, a duplicate arc or circle is defined as two arcs or two circles having the same properties and fulcrum point (x, y, z location).

Figure 6:
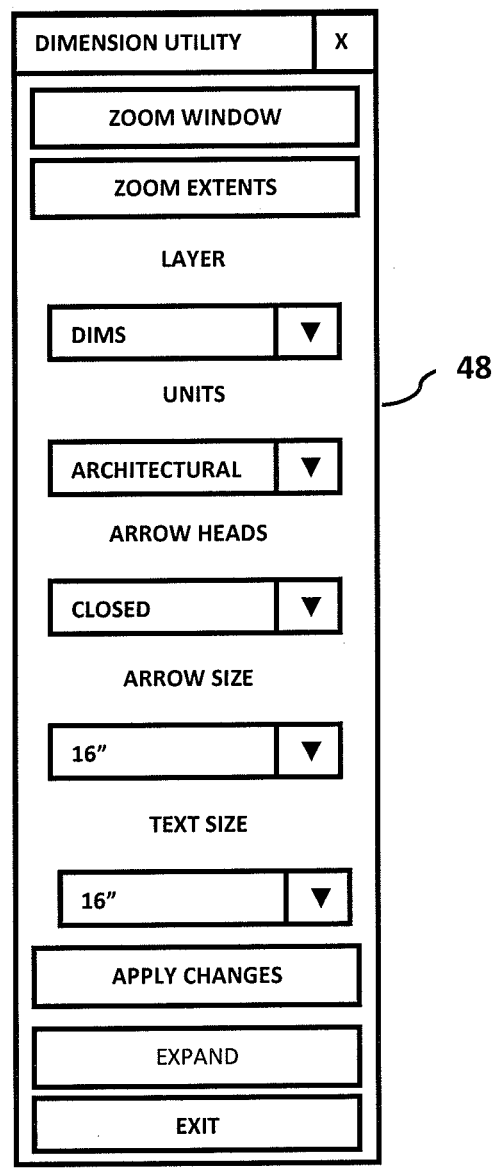
FIG. 6 illustrates an example dialog box for a dimension utility, in accordance with certain embodiments of the invention.

"Dims" button 46 of FIG. 1 enables the user to set consistent formats for different dimensions throughout the drawing and prepares dimensions for import into other programs that may be used in conjunction with the present system. In FIG. 6, Dimension Utility box 48 is shown with drop down menu selections for Layers, Units, Arrow Heads, Arrow Size and Text Size. The "Layer" menu contains a list of layers in the drawing, allowing the user to select the target layer for where dimensions should be placed. The "Units" menu contains a list of units of measurement for the properties of the dimension (e.g., "Architectural," "Decimal," "Engineering," "Fractional" and "Scientific" options). For example, architectural units could all be set to use closed arrow heads and arrows/text of a specific size.

The "Zoom Window" button allows the user to momentarily exit the Dimensions Utility box 48 to maneuver to an area of the drawing. The "Zoom Extents" button zooms to the outer exterior of the drawing. Reconfiguring all the units enables the user to focus on just particular units of interests and facilitates faster clean-up of the drawings.

"Mtext" button 50 and "Text" button 52 of the dialog box 10 effectively operate together. The Mtext button 50 enables the user to convert Mtext (i.e., multi-line text) to a standard text line. For example, a multi-line, Unicode-based text can be gripped and exploded, while maintaining all properties except the Unicode format by removing the Unicode and placing the text into a single line text, which is easier to process in Text Utility dialog box 54 of FIG. 7. Converting multi-line text in this fashion has the added benefit of allowing certain embodiments of the invention to "read" the text so as to retrieve 3D element information for automated 2D to 3D conversion, as further described below.

Figure 7:
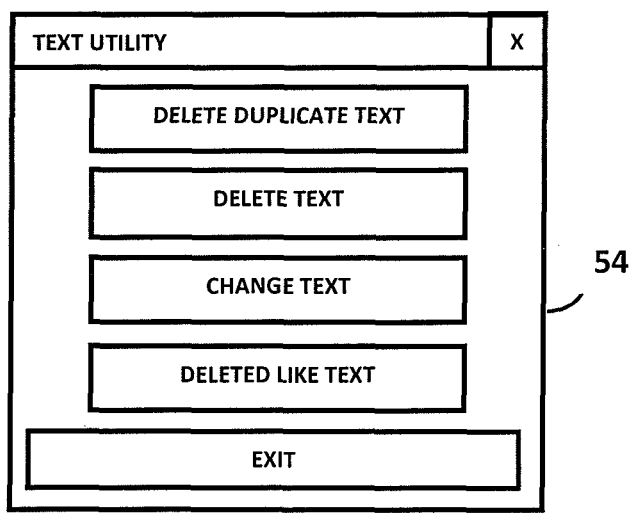
FIG. 7 illustrates an example dialog box for a text utility, in accordance with certain embodiments of the invention.

When the Text button 52 of the dialog box 10 is selected, dialog box 54 of FIG. 7 is opened, and the user is presented with a number of options. The Delete Duplicate Text button deletes text that has been written on top of the same text. In certain embodiments, this function operates in the same manner as the Remove Duplicate Lines button previously discussed (i.e., searching for text objects with the same properties, such as string, text style, and insertion point).

When the Delete Text button is selected, another dialog box is opened that lists all the unique text lines in the drawing. One or more of these text lines can then be selected to delete the selected items. This dialog box also includes an auto-zoom feature that allows the user to zoom to the point in the drawing where the text appears so the user can make a determination as to whether the selected text should be deleted or left alone. The Change Text button allows the user to alter a selected string of text, and selection of the Delete Like Text button prompts the user to select a single text object and have the drawing searched for any identical text. In certain embodiments, when identical text is found, the user is presented with a "Yes" and "No" dialog to determine if the identical text should be deleted or left alone.

Activation of the "Text Style" button 56 of the dialog box 10 displays all the defined text styles that are used in the drawing, as well as one or more additional text styles that were not utilized in the drawing, and gives the user the option of selecting one of these text styles. When a text style is selected, the user is then given the option of converting some or all the text styles in the drawing to the selected text style.

The four layers buttons, "Lyrs On" button 58, "Lyrs Off" button 60, "Lyrs Froze" button 62 and "Lyrs Locked" button 64, display to the user how many layers exist in a drawing and the state of each layer. Selecting the Lyrs Off button 60, the Lyrs Froze button 62 or the Lyrs Locked button 64 causes the layers associated with the selected button to reverse their state. For example, selecting the Lyrs Froze button 62 can cause any layer that is currently frozen in the drawing to be unfrozen.

Figure 8:
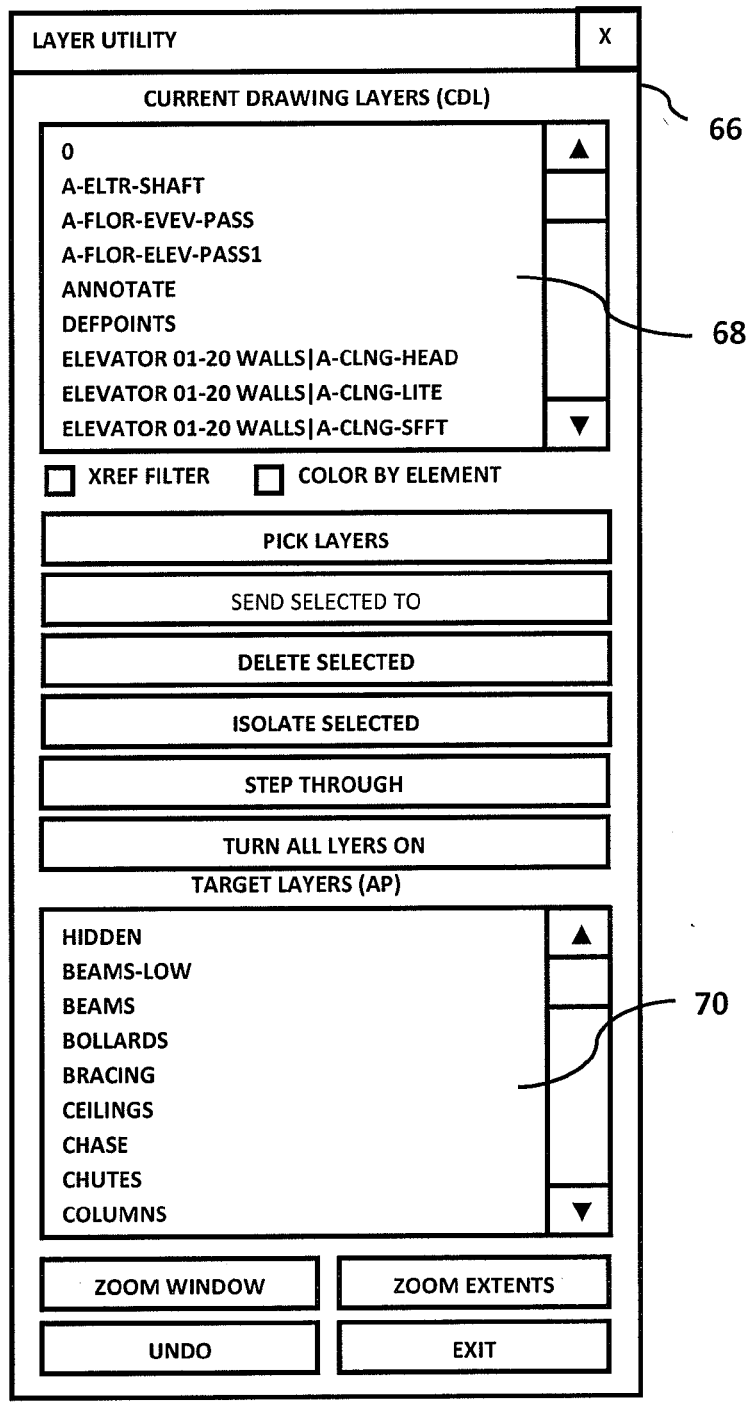
FIG. 8 illustrates an example dialog box for a layer utility, in accordance with certain embodiments of the invention.

In certain embodiments, selection of the Lyrs On button 58 opens Layer Utility dialog box 66 of FIG. 8, which displays all the layers in the current drawing in "Current Drawing Layers" (CDL) pane 68 and provides the user with a number of useful functions. The two selectable options under the CDL pane 68 are "Xref Filter" and "Color By Element." The X-ref filter option causes any layers that are referenced by the prefix of an X-ref to be masked. For example, the X-ref named "ELEVATOR 01-20 WALLS" would be masked, so that the layer entitled "ELEVATOR 01-20 WALLS|A-CLNG-HEAD" is listed as "A-CLNG-HEAD." By masking the X-ref, it is possible to treat all the layers with the same name, such as "A-CLNG-HEAD," in the same manner. Thus, an operation performed on "A-CLNG-HEAD" would also be performed on any other layers of the same name, irrespective of their different X-refs.

The "Color By Element" option maintains a color by the object flag of that object. In certain embodiments, when these objects are then imported into another program, such as AUTOSPRINK, the default setting of that object is Color By Element. The "Pick Layers" button returns the user to the drawing editor and prompts the user to select objects. As objects are selected, the objects are saved to a unique list. When the user returns to the Layer Utility dialog box 66, the layers that are in the list are highlighted and the user is given the option of using the remaining buttons of the utility to reach a desired result. The "Send Selected To" button is operative where there are multiple selections in the CDL pane 68 and only a single selection in the AP Target Layers (AP) pane 70. Selection of this button sends any selected layers in the CDL pane 68 to the targeted layer in the AP pane 70. Any remaining empty layers are then purged from the drawing and removed from the CDL pane 68.

The "Delete Selected" button deletes objects in the layers selected within the CDL pane 68. The "Isolate Selected" button is configured to turn off all layers except for the selected layers in the CDL pane 68. The "Step Through" button allows a user to begin at a selected layer in the CDL pane 68 and to turn off all other layers. Subsequent selection of the Step Through button steps the user to the next layer in the CDL pane 68 and turns off all other layers. The "Turn All Lyrs On" button turns on all the layers remaining in the CDL pane 68.

When work is completed with the four layers buttons, the clean-up process is completed. In certain embodiments, a wizard function can be executed during the clean-up process such that one or more of the functions or steps taken by the user to modify the drawing are recorded for future reference or use in cleaning up additional related drawings.

Figure 9:
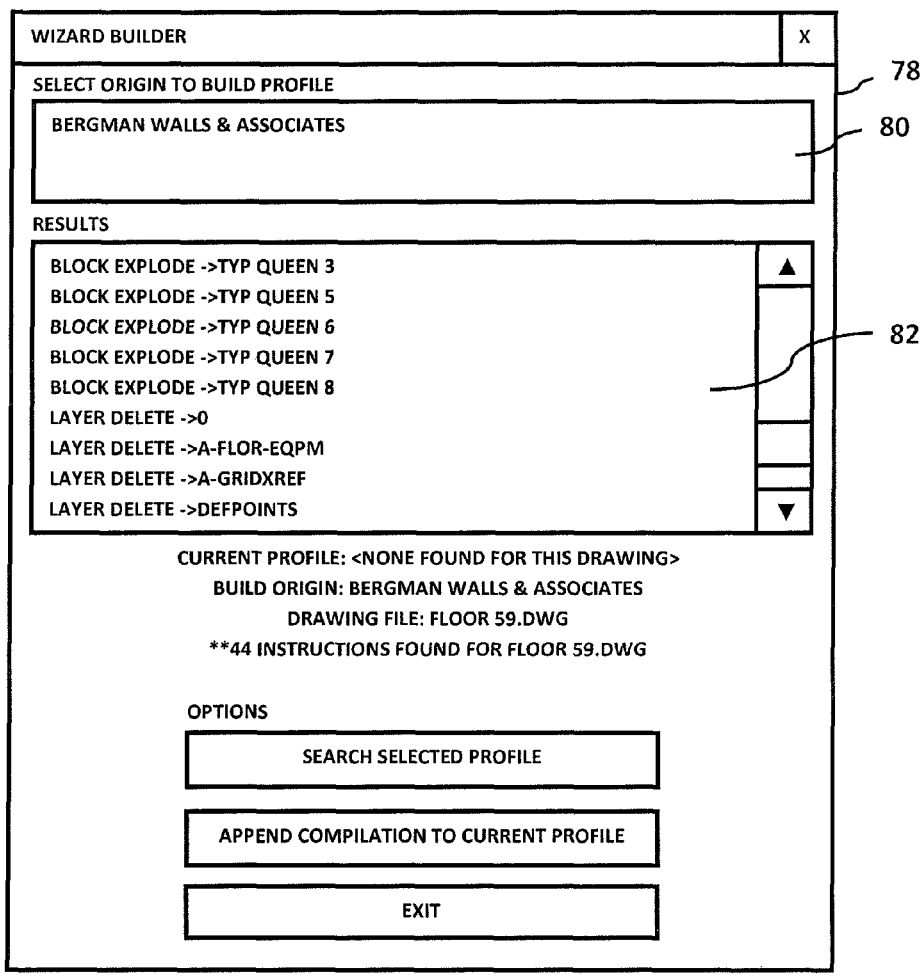
FIG. 9 illustrates an example wizard profile builder utility, in accordance with certain embodiments of the invention.

To better understand embodiments of an example wizard function, reference is now made to FIGS. 1, 9 and 10. The illustrated Wizards module section 70 of the dialog box 10 comprises of five components, option list 72 and four function buttons. The option list 72 includes a listing of all the wizards that are available for use with the current drawing. Once a wizard has been selected from the list 72, that wizard is then displayed within the window of the list while the user is cleaning-up the current drawing.

In certain embodiments, to create a wizard from scratch for the current drawing, the user selects "Create Wizard Profile" button 74. When button 74 is selected, the user is directed to another dialog box prompting the user to enter a wizard name. Once a name has been selected or entered, the user is directed to another dialog box that prompts the user to select or enter the name of the source of the drawing(s) (e.g., typically an architectural/engineering firm or an individual). In certain embodiments, this dialog box can also include a list of previous sources of drawings used for other clean-up processes to make the task of selecting a source easier. Once the source of the current drawing has been established, the wizard is saved and added to the option list 72.

Source information for drawings is important when using "Build Wizard Profile" button 76, which gives the users the option of searching other wizards, based on their source, and importing instructions from other wizards into the current wizard being designed. For example, when button 76 of the dialog box 10 is selected, the user is directed to the Wizard Builder dialog box 78 (FIG. 9), which prompts the user to select a drawing origin from a list of available sources, based on previously created wizards, in Origin pane 80.

When an origin is selected, the user can then select the Search Selected Profile button to obtain a listing in Results pane 82 of available instructions previously created related to that source. The instructions are shown to enable the user to determine if the selected source includes the types of instructions they want to use to build a new wizard. If the selected source includes the desired instructions, clicking on the "Append Compilation To Current Profile" button accepts the instructions and appends them to the wizard profile being created. This same process can be repeated with one or more other sources so that a number of different instructions can be appended to the wizard being built. Once the wizard is built and stored, it can be added to option list 72 of the dialog box 10.

In certain embodiments, to run a wizard profile, the user selects a wizard from those listed in options list 72 and clicks on "Run Wizard Profile" button 84. A wizard profile dialog box then appears giving the user the choice of running all the tasks listed in the main dialog box 10 of FIG. 1 or to select certain of those tasks.

Figure 10A:
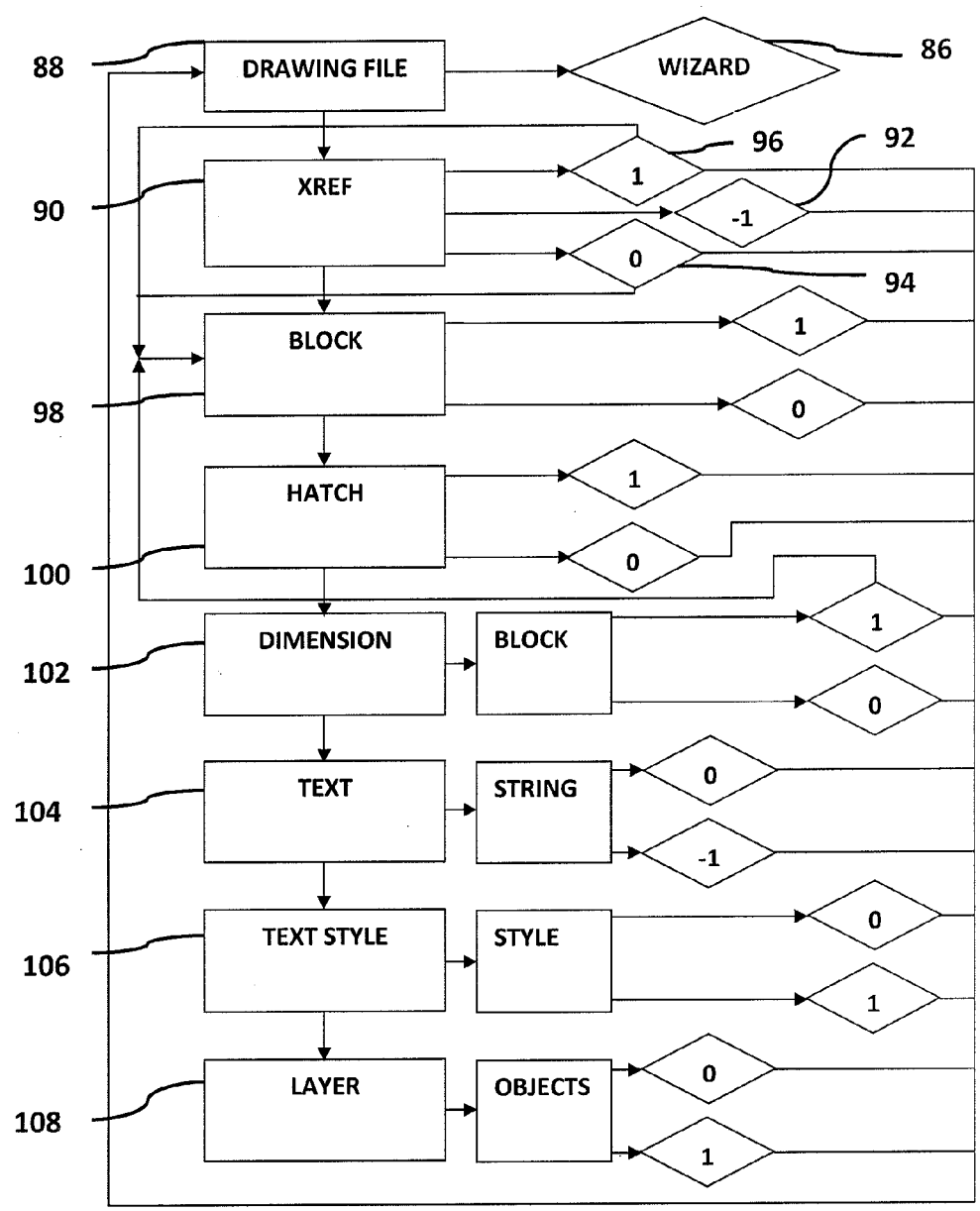
FIG. 10A illustrates a process flow diagram of an example clean-up wizard process, in accordance with certain embodiments of the invention.

The process of running a wizard profile is further illustrated with respect to the process flow diagram of FIG. 10A. For instance, when the WIZARD 86 is initiated, the DRAWING FILE 88 is accessed and opened. As the user performs different functions or steps to modify the selected drawing, the wizard records each of these steps in a log or other like data structure in memory. In certain embodiments, the manner in which the wizard records and prioritizes recorded functions aids in the subsequent thorough cleaning of revised or other drawings.

As the user is required to address X-refs first, the wizard does likewise with XREF 90. In certain embodiments, there are three options for the resolution of X-refs: detach (or delete), insert and bind. Moreover, in certain embodiments, the logic assigned to these functions (e.g., when controlled by the AUTOCAD variable "BINDTYPE") is "−1" for detach 92, "0" for bind 94, and "1" for insert 96. As discussed above, binding an X-ref is different from inserting in that it creates the layer contained in the X-ref with a prefix in the following format: XREFNAME0$0LAYERNAME. Utilization of binding, however, can create hundreds of layers, which can have undesirable results when subsequently using the Layer utility, although use of the X-ref filter option described above can mitigate such problems. The logic assignments and any layer names that are created would then be recorded to the wizard.

BLOCK 98 includes similar options as the X-ref options that are recorded with the block name and the action taken, such as delete or explode. In certain embodiments, AEC blocks can be treated the same as blocks, although their additional geometry would also be stored. Customer blocks can also be treated the same as AEC blocks. HATCH 100 stores the pattern and the points and details on, for example, if the hatch was erased or saved. When future drawings are scanned by the wizard, the wizard grips a hatch and searches the profile for the exact same pattern and points. The hatch is then resolved based on what happened in the first drawing clean-up and whether the hatch was erased or saved. In certain embodiments, line, polyline, arc and circle functions are not recorded by the wizard. Rather, these functions are handled by the main dialog box 10 during the normal clean-up process.

DIMENSION 102 is processed so as to disassemble it from the block within which it is contained. For instance, any Unicode formatting can be removed from the text and the line and arrows are divided into two entities. While dimensions can be processed as a whole group, other embodiments of the invention enable the user to select and alter individual dimensions. In certain embodiments, Mtext functions are not recorded by the wizard and are handled in the same manner as in the main dialog box 10 of FIG. 1.

With continued reference to FIG. 10A, TEXT 104 functions, such as string deletions and/or changes, are recorded into the wizard. TEXT STYLE 106 functions are recorded, as are LAYER 108 functions (e.g., merging a layer or deleting a layer). As can be seen, the wizard function substantially reduces the amount of effort and time required to clean-up drawings that are from the same source or that are similar to a previously cleaned-up drawing.

General contractors typically receive from architects large numbers of drawing files for a project, with the total amount of drawings often numbering in the thousands. These drawing files can comprise, for instance, parent or host drawings, drawings that are referenced by the parent drawings (e.g., X-refs) and stand-alone drawings that are not associated with other drawings. However, the associations between parent drawings and referenced drawings are often not maintained or readily apparent. For instance, oftentimes one or more architects can transfer multiple sets of drawings to the general contractor, such as through a portable storage medium (e.g., disk) or over a network (e.g., the Internet) or other communications link, without maintaining and/or providing any indication of associations between the drawings. This problem becomes especially apparent when using several X-refs in the design process.

For instance, as mentioned above, the use of X-refs provides designers with the leverage to modularize drawings. Thus, a main architect can manage the work and design of the overall layout of a building, while incorporating X-refs of lower-level components (e.g., doors, walls, arches or even a simple textured tile) that are delegated to a second architect or other designer. As each X-ref is modified, the main architect is able to see the changes reflected on the main drawing.

A further advantage of an X-ref is that it reduces the overall file size of the drawing. For instance, a parent or host drawing with an X-ref saves the references only to the external files rather than the entire information of the external files. Thus, instead of storing all the geometry data associated with the referenced files, only the name of and/or pathway to the linked file (e.g., C:\drawings\bridge\beam.dwg) is stored in the current drawing. Also, because X-refs are linked to other drawings, whenever the parent drawing is opened, the parent drawing can reflect the latest changes of the linked files.

For example, if a group of designers is working on a new car design, one of the designers can work on the main body of the car, while a second designer works on the wheels of the car, and so forth. In this case, the main drawing can be the entire car, with multiple X-refs to the wheel drawings and/or other parts of the car. Thus, designers can make as many changes as desired to the wheel drawings and/or other parts, and whenever the main car drawing is opened, the latest version of the wheel design and other parts are rendered on the main car drawing. Moreover, X-refs also provide the advantage of being reusable as a basic design unit. With respect to the automotive design example, a user may be able to design an automobile by using X-refs having pre-existing drawings of individual car components.

In another example, a host drawing depicting the front façade of a building can include a set of windows and a door, which can be incorporated into the host drawing via X-refs. The door may further include a top part, a bottom part, and a handle. Each of these components may, in turn, be represented by drawings incorporated via X-refs into the door drawing. Moreover, the handle itself may comprise an ornate shape that includes individual components represented by drawings incorporated via X-refs into the handle drawing.

Thus, when the parent drawing is opened, each of the X-refs is included in the parent drawing. In the process of rendering each of the first-level X-refs, each X-ref drawing itself is checked for additional lower-level X-refs, which can also be included in the drawing. This recursive process allows for the rendering of nested X-refs, thereby allowing for the modularization of the drawing. For example, in the event that the ornate handle is changed, such a change would be reflected automatically when any drawing that references the ornate handle via X-refs is opened.

One of the disadvantages of X-refs, however, is that they are generally associated with the main, parent and/or "host" drawing through file paths. Thus, problems can arise when a user moves the drawing to a different path (e.g., another file folder) without updating the referenced path in the host drawing and/or transfers a set of drawings without maintaining a similar file structure. In addition, in certain circumstances, X-refs can be shared between multiple host drawings. As a result, if the X-ref is moved, each of the referenced paths in the host drawings would need to be updated. Moreover, since X-refs can be referenced by many different drawings, there are generally no external tags, information or metadata of a particular X-ref that associates the X-ref with a particular drawing.

These disadvantages often require the general contractor who receives a set of drawings from various sources to first visually review the drawings to try to identify which represent host (parent) drawings and which are X-refs, and then to update referenced paths and/or organize the drawings so that they are stored in the locations that correspond to the defined paths of the X-refs. This task can be further complicated by the inclusion of nested X-ref drawings, or drawings that are further referenced by another drawing related to the host drawing.

As can be readily appreciated, such a task of distinguishing between host drawings, X-refs and/or stand-alone drawings can be very time consuming and labor intensive because the general contractor has little way of discerning one type of drawing from another by, for example, names or other metadata associated with the drawings. Rather, each drawing is opened and reviewed visually to make a determination as to its type, and then is sorted accordingly. To further exacerbate this process, each X-ref generally has to be opened using the appropriate AUTOCAD application used to create the drawing, which further adds to the already considerable expenditure of time and effort required.

Figure 10B:
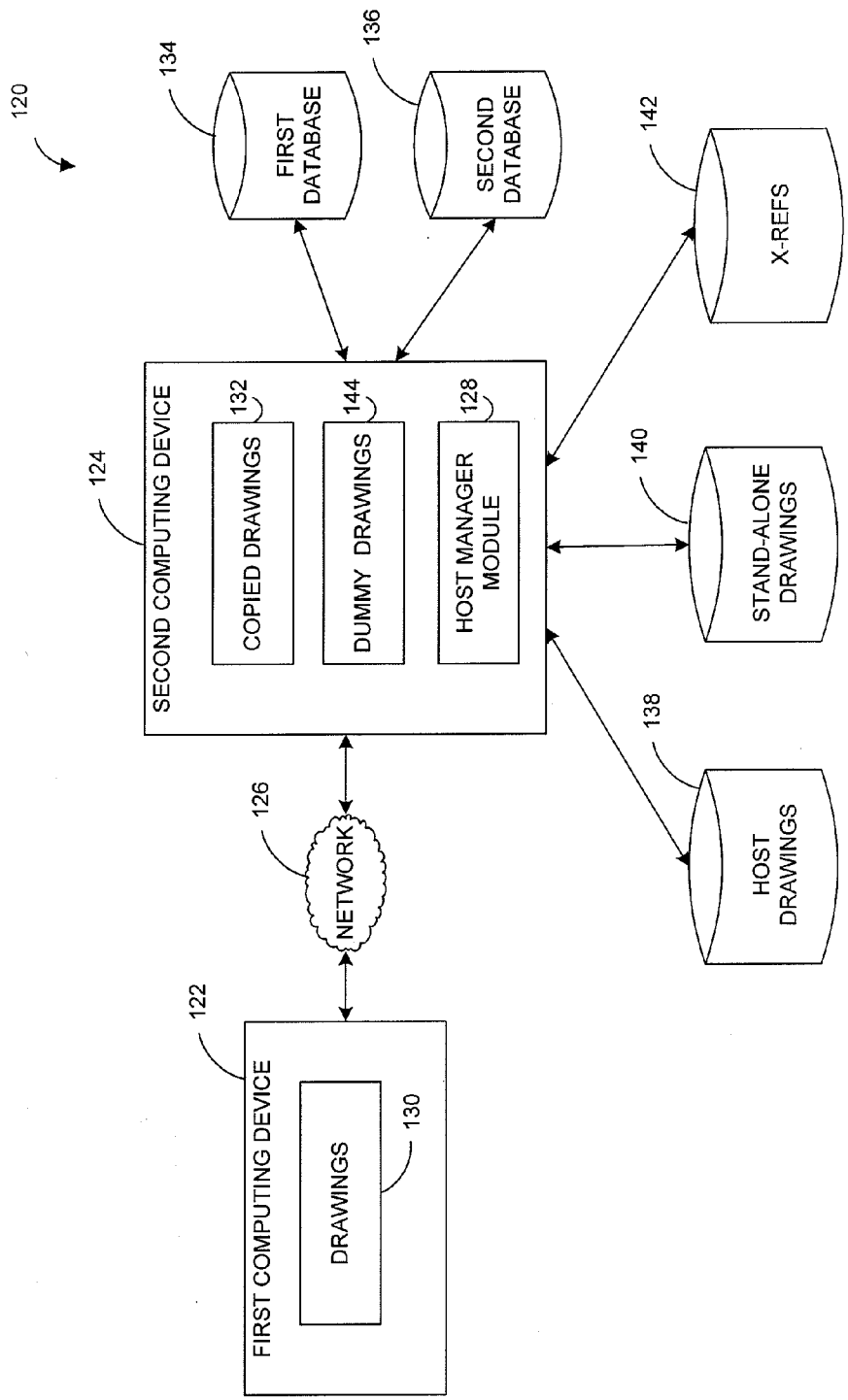
FIG. 10B illustrates an example block diagram of a system for classifying drawings in a CAD environment, in accordance with certain embodiments of the invention.

To address the foregoing, certain embodiments of the invention provide systems and methods for automatically identifying host drawings and/or X-refs from a plurality of drawings. For example, FIG. 10B illustrates a system 120 for automatically classifying and managing drawings in a CAD environment. In general, the system 120 is configured to receive one or more sets of drawings, such as through a network or other communication medium, and classify the drawings as hosts, X-refs or the like, without prior knowledge of the type of drawing. In certain further embodiments, the system 120 can advantageously identify which CAD program and/or version was used to create each drawing.

As shown, the system 120 comprises a first computing device 122 and a second computing device 124 that communicate with each other over a network 126. In certain embodiments, the first and second computing devices 122, 124 can comprise any computing device capable of processing data and include, for example, a server computer, a workstation, a personal computer, a cell phone, a portable computing device, a handheld computing device, a personal digital assistant (PDA) or the like.

The illustrated network 126 advantageously comprises any means for communicating data between two or more systems or components. It certain embodiments, the network 126 comprises a computer network. For example, the network 126 may comprise a public network such as the Internet, a virtual private network (VPN), a token ring or TCP/IP based network, a wide area network (WAN), a local area network (LAN), an intranet network, a point-to-point link, a wireless network, a cellular network, a wireless data transmission system, a two-way cable system, an interactive kiosk network, a satellite network, a broadband network, a baseband network, combinations of the same or the like. In embodiments wherein the first and second computing devices 122, 124 are part of the same computing system, the network 126 may represent a communications socket or other suitable internal data transfer path or mechanism.

In yet other embodiments, data can be transferred between the first and second computing devices 122, 124 via a portable storage medium, such as a compact disk (CD) or the like. In yet other embodiments, the system 120 can have a single computing device, such as a central server, that is accessible by multiple parties participating in the generation and/or revisions of a set of CAD drawings.

As shown, the second computing device 124 further comprises a host manager module 128. In certain embodiments, the host manager module 128 is configured to automatically categorize members of a collection of CAD drawings as host drawings, stand-alone drawings and/or X-refs. For instance, with respect to system 120, the first computing device 122 can comprise an original set of CAD drawings 130 generated and/or revised by a user, such as an architect or other designer, and that are sent to the second computing device 124. In order to maintain a clean set of the drawings 130, the host manager module 128 can create a duplicate set of the drawings (i.e., copied drawings 132) for further processing.

In order to automatically sort each of the copied drawings 132 without having preexisting knowledge as to the types of the drawings (e.g., host, X-ref), the host manager module 128 maintains a list or other record of all the drawings that do not include one or more X-refs in a first database 134 and a list or other record of all the X-refs referenced by the drawings 132 in a second database 136. It will be appreciated that the first and second databases 134, 136 can comprise any data structure and/or device capable of storing data, such as in a list, table, flat file or other format. Thus, while the first and second databases 134, 136 are shown for exemplary purposes as being separate components, in other embodiments of the invention, these databases can be combined in a single database or other data structure.

Figure 10C:
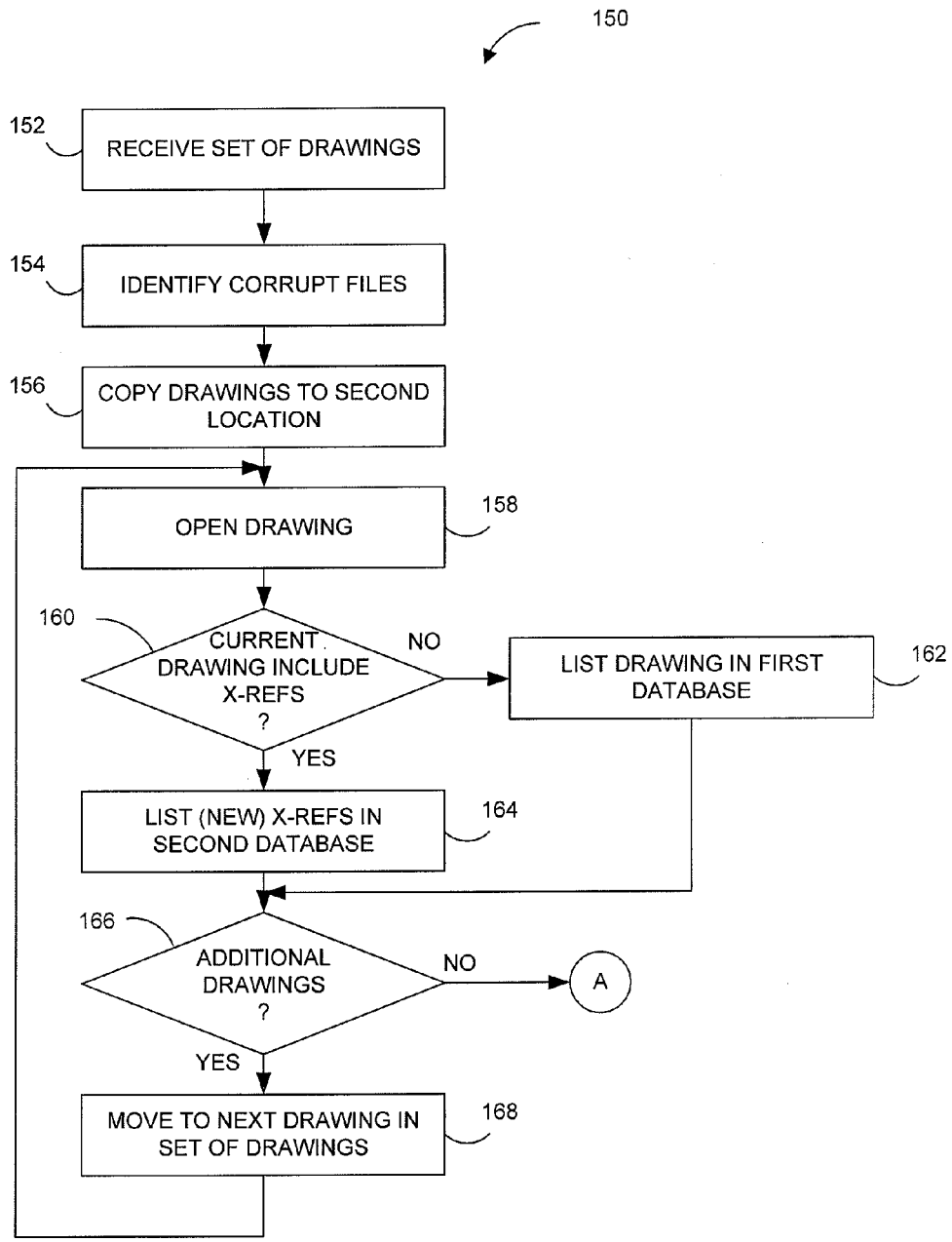
FIGS. 10C and 10D illustrate an example flowchart of a process that can be performed by the system of FIG. 10B for automatically classifying CAD drawings.
Figure 10D:
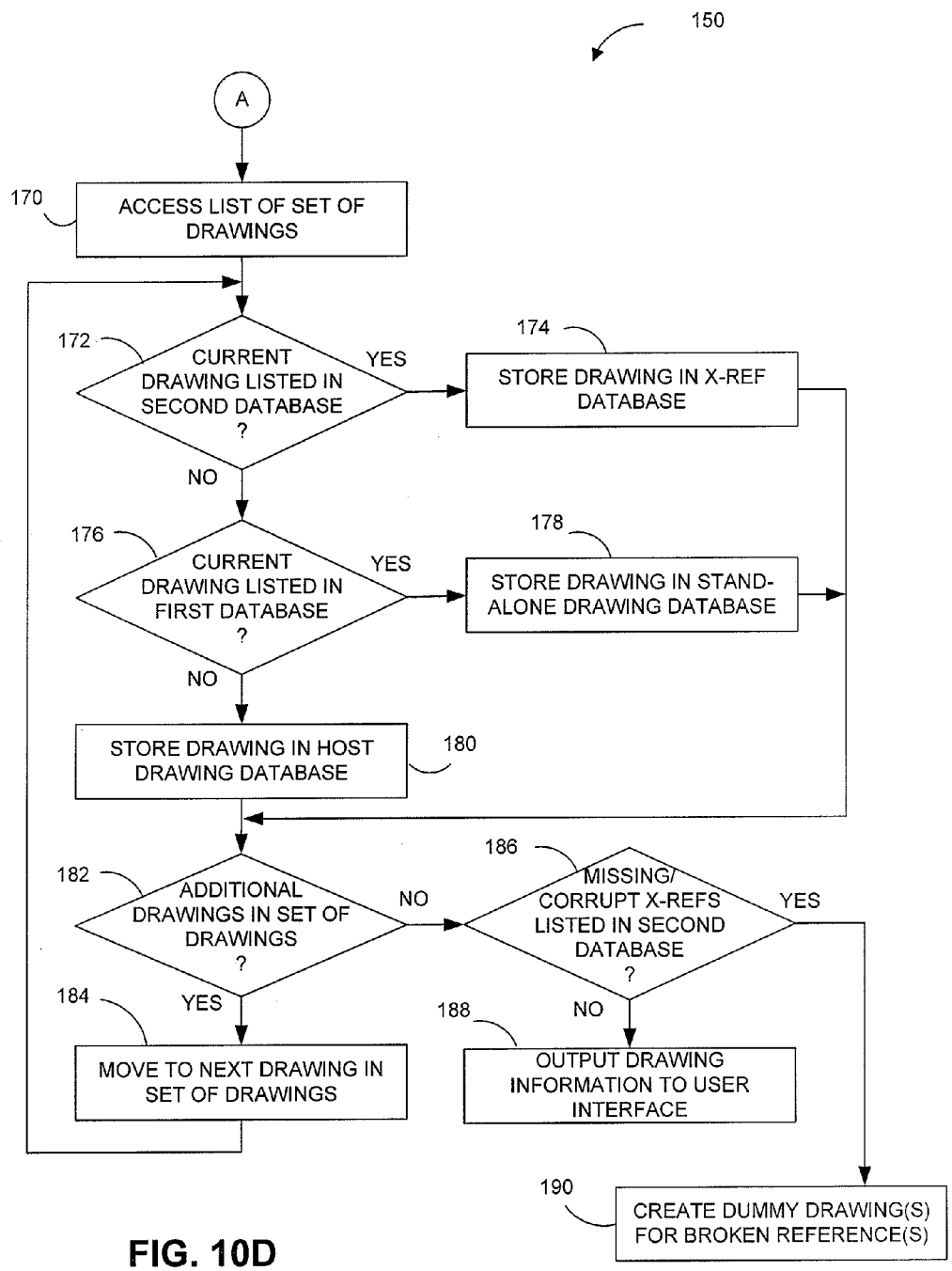

Upon categorizing each of the copied drawings 132, such as described in more detail with respect to FIGS. 10C and 10D, the host manager module 128 can store each drawing in a respective folder, location and/or database, as illustrated by host drawings 138, stand-alone drawings 140 and X-refs 142. Moreover, for those X-refs that are corrupted and/or have broken links, the host manager module 128 can further create one or more dummy or proxy drawings 144 to use in place of the particular X-refs to prevent system and/or application crashes, as discussed in more detail below.

FIGS. 10C and 10D illustrate a flowchart of a process 150 for automatically identifying host drawings, stand-alone drawings (i.e., host drawings without X-references) and X-refs from a set of drawings. In certain embodiments, the process 150 is configured to identify and classify such drawings without prior knowledge or external identification of the type of drawings received and/or the associations therebetween. For exemplary purposes, the process 150 will be described with reference to the components of the system 120 of FIG. 10B.

As illustrated, the process 150 begins at Block 152 by receiving a set of drawings. In certain embodiments, the host manager module 128 of the second computing device 124 receives the drawings 130 as modified and/or prepared on the first computing device 122. In certain embodiments, the drawings 130 are transmitted over the network 126 (e.g., via file transfer protocol (FTP)), are transferred via a CD or other storage medium, or the like. For instance, in certain embodiments, the drawings 130 can represent a set of CAD drawings being sent from an architect for further review by a general contractor.

At Block 154, the host manager module 128 identifies corrupt files from the set of drawings. For instance, in certain embodiments, the host manager module 128 tries to open each of the drawings. If the module 128 is successful in opening the drawing, the drawing is considered to be usable. However, if the module 128 is not able to successfully open the drawing, the drawing is classified as a corrupt file.

At Block 156, the host manager module 128 creates of copy 132 of the set of drawings 130. This advantageously allows the system 120 to process the copy of drawings without affecting the original set of drawings in the event that the system needs to re-access a clean set of the drawings 130. Of course, in other embodiments of the invention, the process 150 can be performed on the original set of drawings 130 sent from the first computing device 122.

At Block 158, the host manager module 128 opens a first one of the copied drawings 132 and determines if the drawing has any associated X-refs (Block 160). For instance, in certain embodiments, the host manager module 128 accesses a reference table (e.g., DWG reference table) within the current drawing that identifies the other drawings that are associated with or to be linked to the current drawing (e.g., X-refs).

If the current drawing does not include one or more X-refs associated therewith, an identification of the current drawing (e.g., name and/or path of the current drawing) is stored in the first database 134 (Block 162). On the other hand, if the current drawing is associated with one or more X-refs, the X-refs are identified in the second database 136, such as in a list or other data structure (Block 164). In certain embodiments, if the X-refs are already identified in the second database, the process 150 does not require that an identification of the X-ref be stored again.

Following Blocks 162 or 164, the host manager module 128 determines if there are additional drawings to be analyzed in the drawings 132 (Block 166). If so, the host manager module 128 moves to a next one in the set of drawings 132 (Block 168) and returns to Block 158. If all the drawings 132 have been reviewed, the process 150 continues with Block 170 to access and traverse a master list of the drawings 132.

At Block 172, the host manager module 128 determines if a current drawing identified in the master list is also listed in the second database 136. If so, the host manager module 128 identifies the current drawing as an X-ref and stores the current drawing in the X-ref database 142 (Block 174). If the current drawing is not in identified in the second database 136, the host manager module 128 determines if the current drawing is identified in the first database 134 (Block 176). If the current drawing is identified in the first database 134, the drawing is identified as a stand-alone drawing (e.g., a drawing that does not reference and is not referenced by any external drawings) and is stored in the stand-alone drawing database 140 (Block 178). If the current drawing is not listed in either the first or second databases 134, 136, the drawing is identified as a host drawing (e.g., a drawing that references, but is not referenced by, one or more external drawings) and is stored in the host drawing database 138 (Block 180).

Following Blocks 174, 178 or 180, the process 150 continues with Block 182 to determine if there are additional drawings 132 that need to be categorized. If so, the host manager module 128 moves to the next drawing (Block 184) and returns to Block 172. If all the drawings have been categorized, the process 150 continues with Block 186 to determine if any X-refs listed in the second database 136 are not contained in the drawings 132 (e.g., if there are broken references). If not, the process 150 outputs the final drawing information to the user, such as via a computer display or like interface (Block 188).

If there are broken references, the process at Block 190 creates dummy drawings 144 for each of such references. For example, a broken reference can arise when a user does not transfer a full set of drawings to the second computing device 124. Such may occur when certain X-refs have not been modified during the design process and the user deems it unnecessary to transfer the unchanged X-refs. In certain embodiments, each dummy drawing comprises a blank CAD drawing (or proxy drawing) that is assigned the same pathname as the broken reference. In yet further embodiments, when coming across a broken reference, the host manager module 128 can automatically search a defined number of higher-level and/or sister folders and/or a designated folder within the file system to search for a copy of the particular drawing prior to creating and/or assigning a dummy drawing.

Figure 10E:
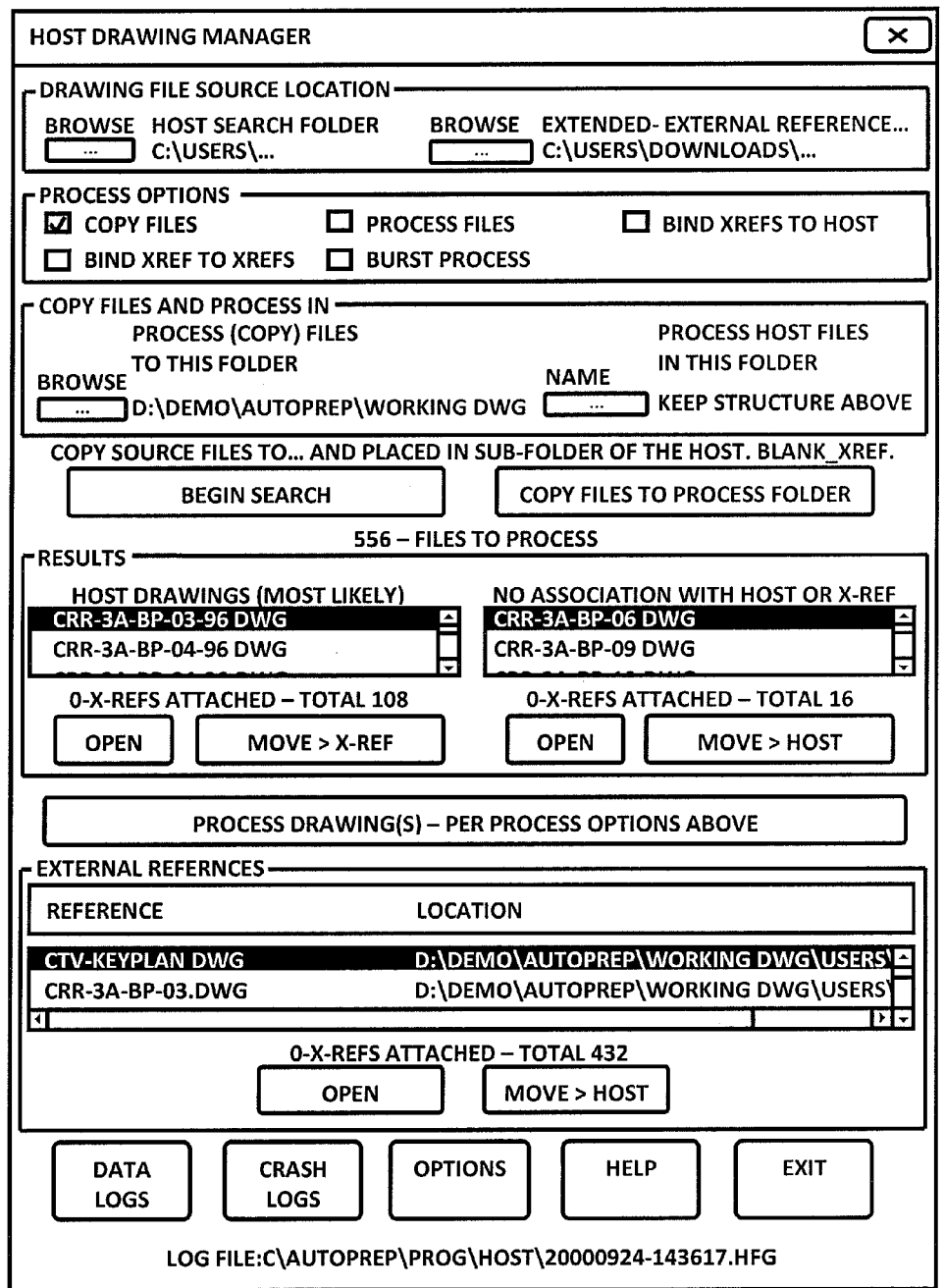
FIG. 10E illustrates an example dialog box of a main interface for a host manager utility, in accordance with certain embodiments of the invention.

FIG. 10E shows an example screen display of a main interface dialog box 200 for the Host Drawing Manager utility. In certain embodiments, the dialog box 200 can be used to initiate one or more functions described in the process 150 of FIGS. 10C and 10D. For instance, the dialog box 200 includes user-selectable buttons for performing desired functions and panels that enable a user to select desired files for additional processes. For example, the two browse buttons under the "Drawing File Source Location" group allow the user to select a folder location to be searched for host drawing files and to select a folder location to be searched for X-ref files.

The "Process Options" group of the Host Manager utility allows the user to control operations on files during and after the search processes. The "Copy Files" checkbox is selected in order to have sort and review process conducted with copies of the original files rather than with the original files (see, e.g., Block 156 of process 150). For example, the user may choose to bind all X-refs to the corresponding host references after the search and classification processes are completed. By processing copies, instead of the originals, the system allows the user to revert to the original drawings if an error is encountered or discovered during processing of the drawing files.

The "Process Files" checkbox results in execution of the processing operation immediately after the search process completes. This allows for the search and processing to run unattended, which may be an extended period of time when handling a large number of files or with files with large sizes. The user also has the option to bind X-refs to the host (i.e., via "Bind Xrefs to Host" checkbox), and to additionally bind nested X-refs (e.g., via "Bind Xrefs to Xrefs" checkbox). In certain embodiments, binding nested X-refs recursively binds X-refs to X-refs, starting at the deepest level of nesting. For example, if Drawing A has a reference to Drawing B, and Drawing B has a reference to Drawing C, then the drawing C is first bound to Drawing B, and Drawing B is then bound to Drawing A.

The left browse button under the "Copy Files and Process In" heading enables the user to select a folder location where files are copied to and processed. The right browse button allows the user to specify a folder for the host files. Alternatively, the user may be allowed to retain the structure of the original files. For example, the user may have received all the files in a single folder. By choosing to retain the structure of the original files, a directory structure can be built using the paths in the X-refs.

For example, a drawing may include two X-refs, each having the path: "Building1\V1\". During reconstruction, an embodiment of the invention can create a subfolder called Building1, followed by creating a subfolder V1 inside the Building1 subfolder. Once this directory structure is created, the two X-refs could then be copied to the V1 subfolder. Such reconstruction would allow a second user to receive disorganized files from a first user and automatically be able to reconstruct the directory structure used by the first user in order to have consistent file organization.

The "Begin Search" button allows the user to execute the selected "process" options. The results of the search process are displayed in the "Host Drawings," "No Association With Host or X-Ref," and/or "External References" windows. The Host Drawings window shows the files identified as being probable host drawings (e.g., stored in database 138 of FIG. 10B). The No Association With Host or X-Ref window shows the files identified as not being attached to a host or X-ref file (e.g., stored in database 140). Immediately below these two windows are buttons for the user to manually open and/or move selected files to the list of X-refs or to the list of host drawings. Files identified as being X-refs are displayed in the External References window. Buttons immediately below this window, enable the user to open selected files and/or move selected files to the host drawings list. Along the bottom of the Host Manager utility box 200 are the Data Log button and the Crash Log button. Selecting these buttons brings up the Master Drawing Management Reports utility, which is further described hereinafter.

Although the Host Drawing Manager dialog box 200 has been described with reference to particular embodiments, it will be understood that the dialog box can function with more or fewer features than those illustrated in FIG. 10E. Rather, the dialog box 200 is described as merely an example of a user interface means executable on or in connection with the second computing device 124 and/or host manager module 128 of FIG. 10B for receiving and/or displaying information usable for performing particular processing functions, such as the process 150 of FIGS. 10C and 10D.

In certain embodiments, once a set of drawings is categorized, a user may want to bind the drawings in order to send or save a single drawing, as opposed to multiple drawings, to a third party. For instance, as discussed above, a user can bind X-refs to a host drawing to create a single file representing a complete drawing.

This binding process, however, especially when dealing with hundreds of host references and X-refs, can take a substantial amount of time. Moreover, with conventional systems, if a broken, corrupt or missing X-ref or other error is encountered during the binding process, the entire process aborts, leaving the user to attempt to locate the cause of the crash and to restart the binding process.

Moreover, in certain circumstances, the binding process can be part of a much larger routine, or process such as the batch comparing of hundreds of drawings, the cleaning-up of drawings, or the like, examples of which are discussed in more detail herein. For instance, because of the time and resources required to execute the batch comparisons, it can be advantageous to run the comparison(s) overnight or during another downtime of the computer network. In such situations, however, a small error encountered while binding X-refs has the potential to shut down the entire batch comparison process and again leave the user to identify the error (e.g., a corrupt X-ref) and restart the entire process.

In view of the foregoing, systems and methods disclosed herein advantageously execute a crash log process that automatically identifies the causes of errors during one or more routines, such as while binding X-refs to a host drawing, batch comparing multiple drawings, cleaning up drawings, combinations of the same or the like or the like. Moreover, embodiments of the inventive crash log process and system can further dynamically replace corrupt drawings with dummy drawings so that the desired process can continue to completion without substantial interruption.

Figure 10F:
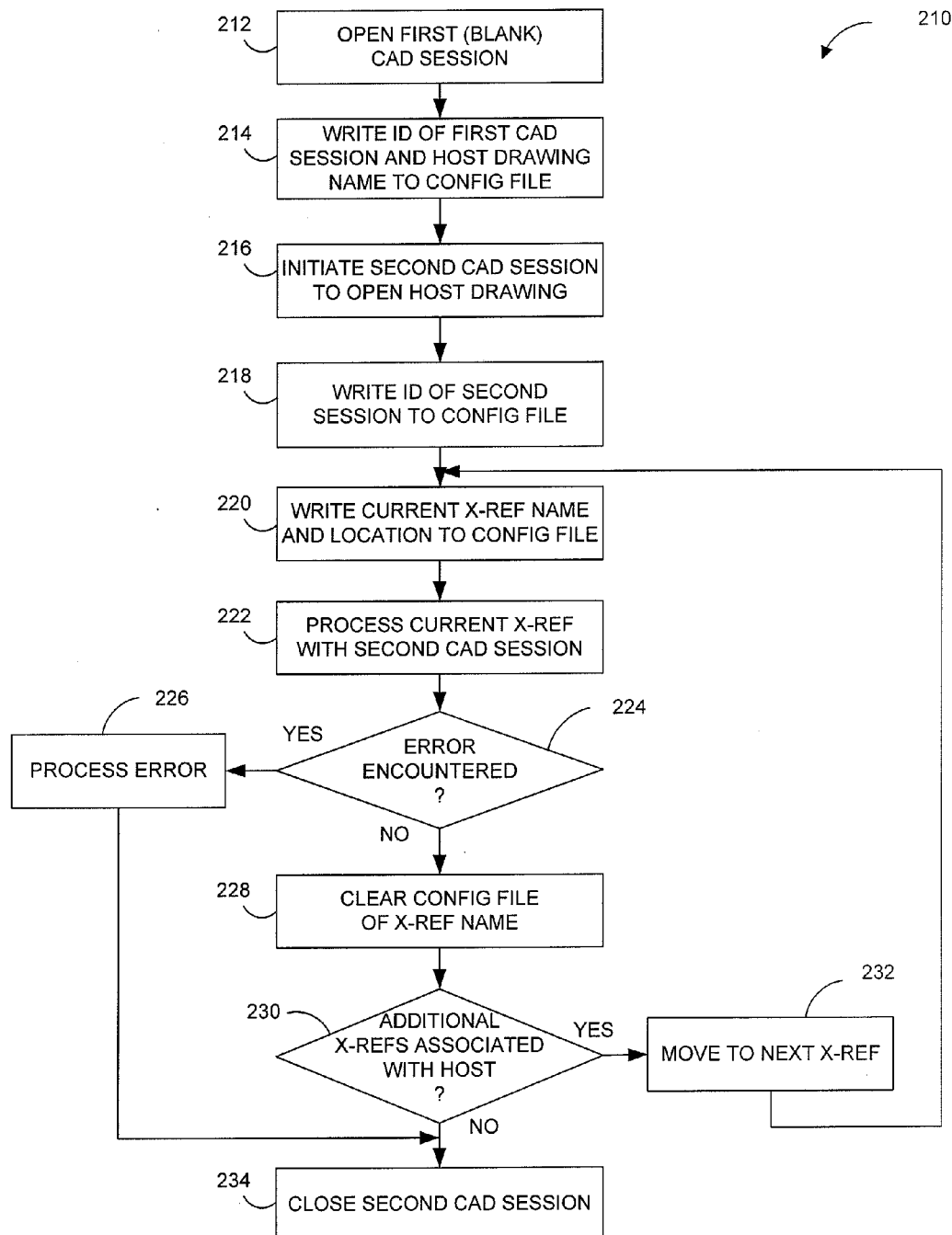
FIG. 10F illustrates an example flowchart of a crash log process usable in binding external references in a CAD environment, in accordance with certain embodiments of the invention.

FIG. 10F illustrates an exemplary embodiment of a flowchart of a crash log process 210 according to certain embodiments of the invention. For exemplary purposes, the process 210 is described herein with reference to components of a crash log system 420 of FIG. 10K. Although each of the process 210 and the system 420 is described with reference to a binding routine, it will be understood that the crash log process 210 can be used in a variety of processes to identify and address unforeseen events and problems that can cause a CAD session to crash or suspend activity.

Figure 10G:
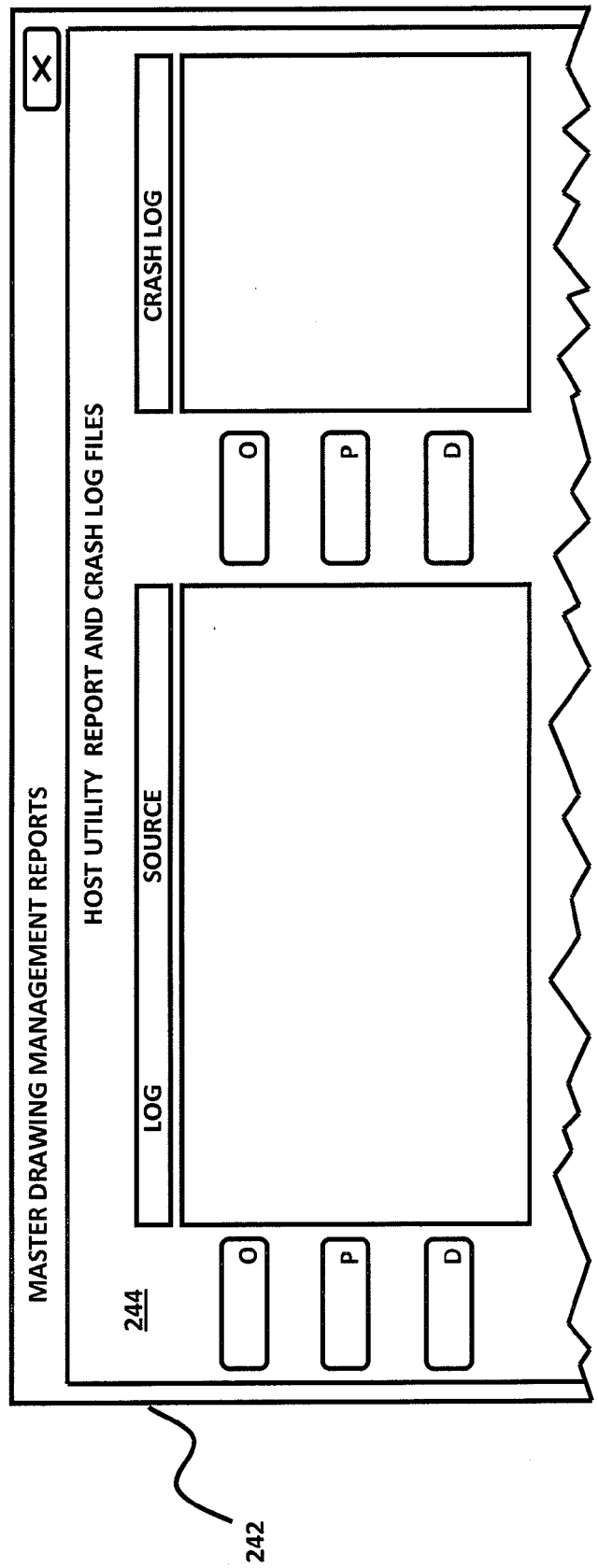
FIGS. 10G through 10I illustrate example dialog boxes for a master drawing management reports utility, in accordance with certain embodiments of the invention.
Figure 10H:
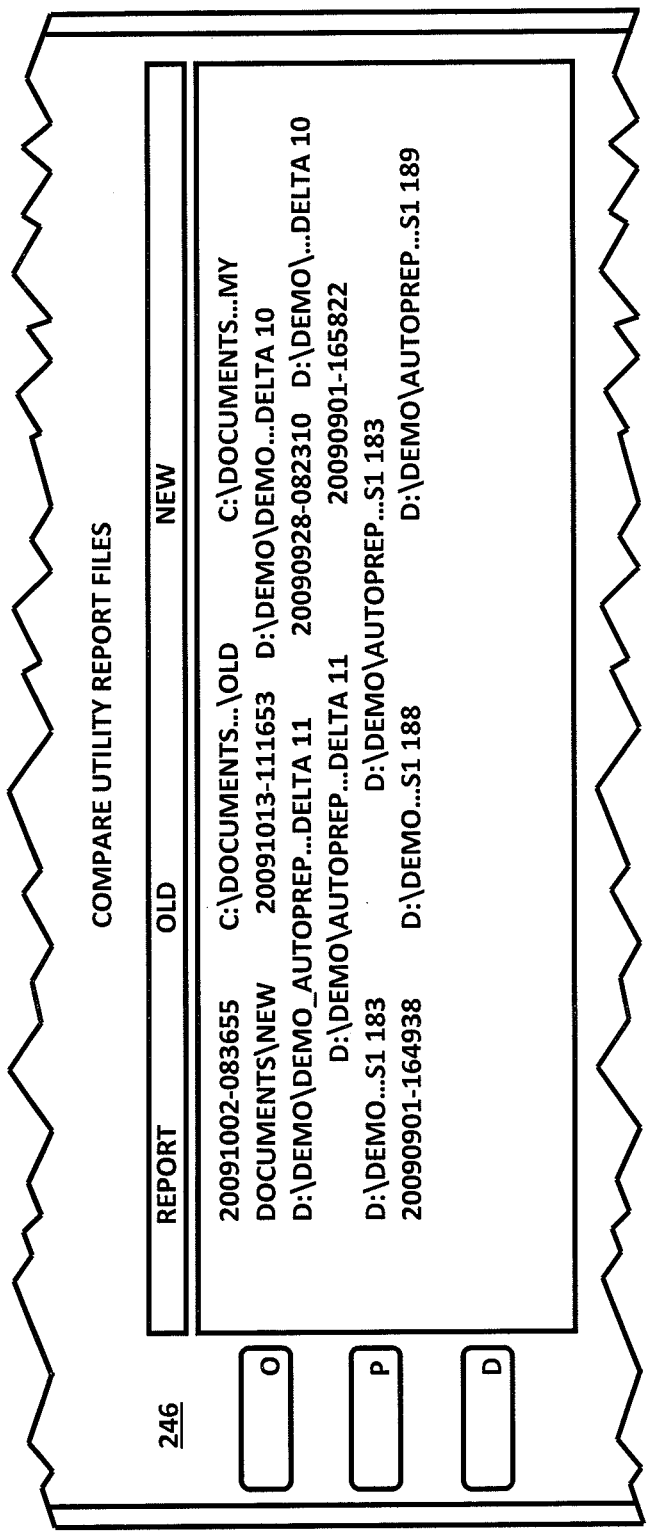
Figure 10I:
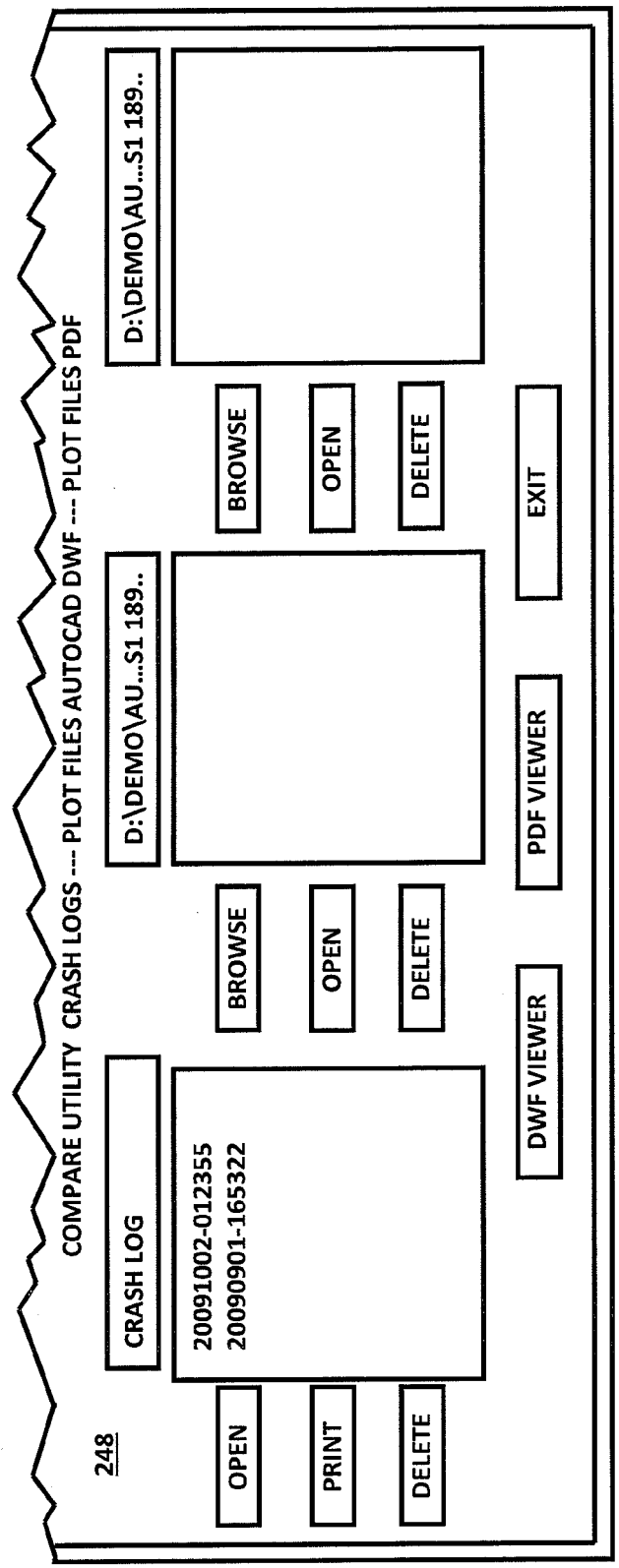
Figure 10J:
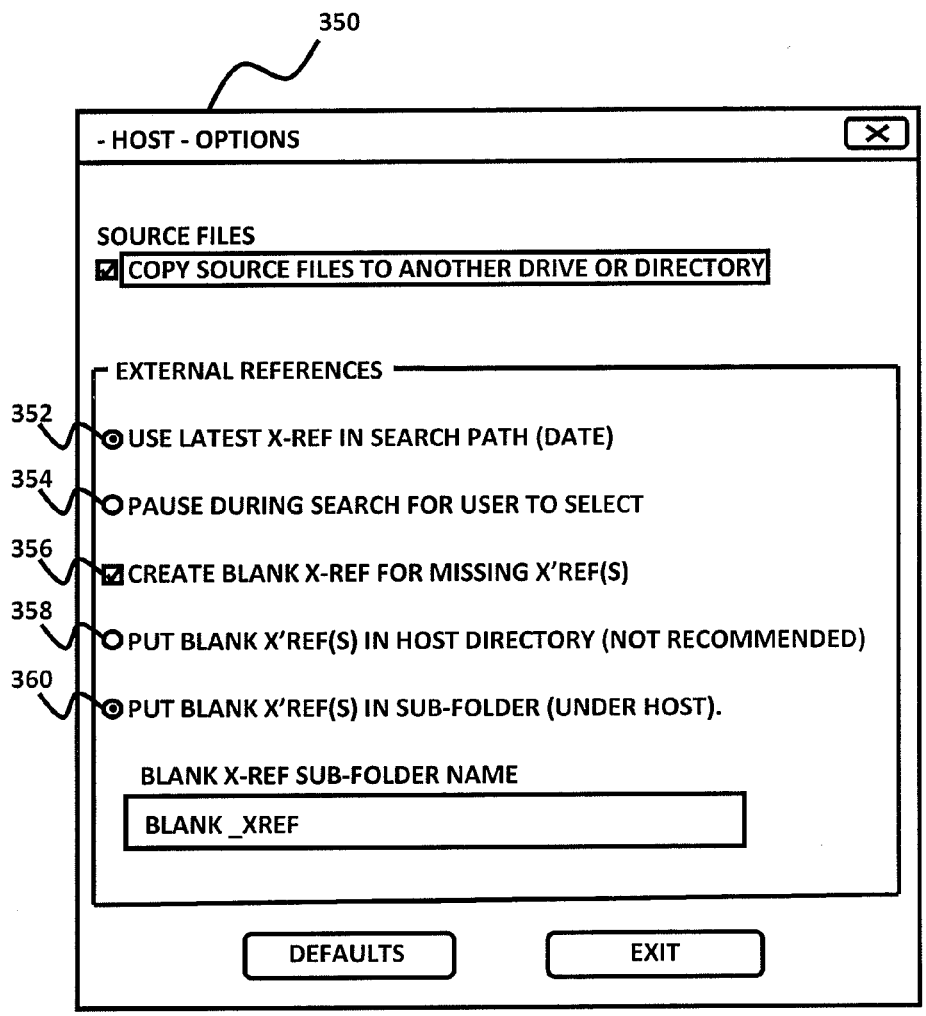
FIG. 10J illustrates an example dialog box of a host manager utility, in accordance with certain embodiments of the invention.
Figure 10K:
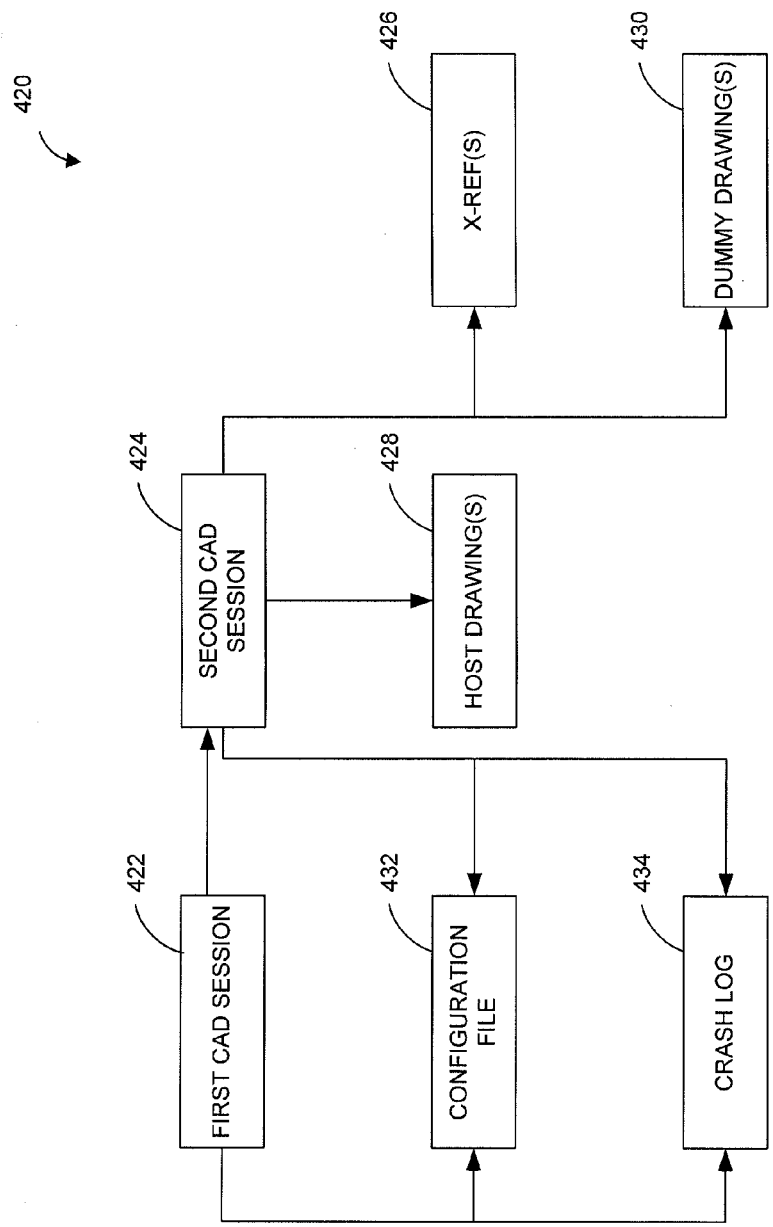
FIG. 10K illustrates an example block diagram of a system for managing crash events in a CAD environment, in accordance with certain embodiments of the invention.

For example, the crash log system 420 of FIG. 10K comprises a plurality of components that can execute and/or be stored on one or more computing devices, such as a server or the like. As shown, the crash log system 420 comprises a first CAD session or instance 422 and a second CAD session or instance 424 that are used, in certain embodiments, to bind one or more X-refs 426 to one or more host drawings 428. In certain embodiments, the system 420 is further able to generate and/or bind one or more dummy drawings 430 in place of broken or corrupt references. As is also illustrated, the crash log system 420 includes a configuration file 432 and a crash log 434, each of which is described in more detail below with reference to the process 210 of FIG. 10F.

With respect to FIG. 10F, the process 210 begins with Block 212, wherein the first CAD session 422 is opened. In certain preferred embodiments, the first CAD session 422 advantageously comprises a blank session with no open drawing. In further embodiments, if more than one CAD session is currently open, the process 210 prompts the user to close all but one CAD session.

At Block 214, the first CAD session 422 writes the session or process identification ("ID") to the configuration file 432. In certain embodiments, the process ID is captured from a list of all processes then executing on the particular computing device. For instance, in certain embodiments, the DOS command "TASKLIST" is used to return a list of all running processes, from which the process ID of the CAD session is obtained. The name of the host drawing 428 to be processed (e.g., bound to X-refs 426) is also written to the configuration file 432. For instance, in certain embodiments, the first CAD session 422 writes a "runstart" command to the configuration file 432 along with the name of the host drawing 428, which directs, in turn, the second CAD session 424 to open the host drawing 428 (Block 216). In certain embodiments, the configuration file 432 comprises a text file (e.g., an .ini file), an XML file, a YAML file, a database, or other like data structure.

At Block 220, the process 210 writes the session ID of the second CAD session 424 to the configuration file 432. At this point, the process 210 begins individually binding the X-refs 426 to the current host drawing 428. For instance, the second CAD session 424 can move serially through the X-refs listed in the host drawing's 428 external reference table to bind each of the X-refs to the host drawing. At Block 222, the process 210 writes the name of the individual X-ref 426 to be processed, and/or its pathname location, to the configuration file 432. The second CAD session 424 then processes the X-ref 426 to bind the X-ref to the host drawing 428.

If the second CAD session 424 encounters an error (Block 224) during this process, the error is handled at Block 226. In certain embodiments, the first CAD session 422 monitors the activity of the second CAD session 424 to identify any errors in the binding process. For instance, the first CAD session 422 can monitor the second CAD session 424 for any pause, suspension or interruption in activity longer than a predetermined time (e.g., no activity for at least ten seconds). If such occurs, the first CAD session 422 can assume that a crash or other error occurred with the binding process of the second CAD session 424.

In yet further embodiments, the first CAD session 422 can determine if particular windows or alerts are generated by the second CAD session 424 during the binding process. For instance, the first CAD session 422 can identify if certain .dll files or the like are called during the binding process. If such occurs, it can be assumed that activity by the second CAD session 424 has been interrupted while a window, dialog box or the like has been displayed to convey information to (e.g., an alert), and/or request information from, a user. In this circumstance, if the alert or request for information is not addressed, such as when the program is being executed overnight, execution of the entire program can be paused until a user returns to restart the process.

In yet other embodiments, if the encountered error is caused from outside the CAD environment, then a "send dump" command (e.g., SENDMP in WINDOWS) can be detected and the second CAD session 424 can be shut down. Alternatively, a daemon or some equivalent background process can continuously examine the list of active processes in place of monitoring by the first CAD session 422 in order to detect crashes by the second CAD session 424.

In processing an error at Block 226, the first CAD session 422 can access the configuration file 432 for the name of the current X-ref 426 and host drawing 428 that caused the crash. In certain embodiments, this information is then written to the crash log 434 by the first CAD session 422. Following such identification, the process 210 can proceed with Block 234 to close the second CAD session 424 (e.g., if not already closed). In certain further embodiments, the process 210 can proceed to reopen another CAD session that commences the binding process where the terminated second CAD session 424 left off (e.g., with binding the next X-ref based on information in the configuration file 432 and/or the crash log 434).

If there is no error encountered with the binding process at Block 224 (e.g., the X-ref 426 is successfully bound to the host drawing 428), the process 210 clears the configuration file 432 of the X-ref name at Block 228. In certain embodiments, the process 210 also clears the configuration file 432 of the host drawing name and/or the ID of the second CAD session 424.

At Block 230, the process 210 determines if there are additional X-refs 426 to be bound to the host drawing 428. If so, the process 210 moves to the next X-ref 426 and returns to Block 220. If all the appropriate X-refs 426 have been bound to the host drawing 428, the process 210 continues with Block 234 to close the second CAD session 424. In further embodiments, relevant portions of the process 210 could be repeated for each host drawing 428 that needs to be bound (e.g., determined from an array or other list of all host drawings 428). For instance, the first CAD session 422 could initiate one or more new CAD sessions to further process the additional host drawings 428 and their respective X-refs 426.

Although the process 210 has been described with reference to particular arrangements, other embodiments of the invention can perform more or fewer acts than those described with reference to FIG. 10F. For example, in certain embodiments, when encountering an error (e.g., a broken X-ref) at Block 224, the process 210 can create and/or bind one of the dummy drawings 430 (e.g., a proxy drawing) in place of the referenced X-ref. In such embodiments, the dummy drawing 430 can be assigned the name of, and/or replace, the broken or corrupt X-ref so that second CAD session 424 can continue binding other X-refs 426 to the current host drawing 428 without terminating prematurely. Thus, following Block 226, the process 210 could write the name of the broken X-ref 426 to the crash log 434 and continue with Block 228, thereafter moving to the next X-ref 426 to be bound.

Moreover, it will also be understood from the disclosure herein that the process 210 can also be executed when binding X-refs to other (parent) X-refs. Furthermore, the process 210 can be performed on a single computing system having multithreading capabilities or on multiple computers coupled through a network.

FIGS. 10G through 10I illustrate exemplary screen displays of an embodiment of a Master Drawing Management Reports dialog box 242. In certain embodiments, this dialog box 242 can be accessed by selecting either the Data Logs button or the Crash Logs button from the Host Manager Utility box 200. In particular, FIG. 10G shows a top portion 244 of the Master Drawing Management Reports dialog box 242, which provides windows and buttons for viewing, deleting and printing from the data log, or configuration file, and the crash log. FIG. 10H illustrates a middle portion 246 of the dialog box 410, which provides windows where data log and crash log reports can be compared. Along the left side of the viewing windows for the data log, crash log, compare utility report files and compare utility crash reports logs, are buttons that can be selected to open, delete or print selected files in each window.

FIG. 10I illustrates a bottom portion 248 of the dialog box 242. For instance, if the user chooses to save drawings to a DWF or PDF file format rather than to a plotter, the "DWF Viewer" button and the "PDF Viewer" button allow the user to select a third-party DWF or PDF viewer to view the files. For example, selecting the PDF Viewer button may bring up a dialog box listing all available programs in the user's computer. The user may then scroll through the listed programs to select the corresponding PDF program, such as ADOBE PDF, XPDF, or the like.

Returning to FIG. 10E along the bottom portion of the dialog box 200 is an Options button, which brings up a Host Manager utility options dialog box, an example of which is shown as dialog box 350 in FIG. 10J. For instance, the illustrated dialog box 350 comprises a plurality of inputs for prompting the user to manually identify and/or classify a particular X-ref. Through the use of a checkbox, for example, a user can select to have the source files copied to another location, such as a drive or a directory, prior a search and/or classification process (e.g., the process 150).

As shown, checkbox 352 sets the option for using the most recent version of an X-ref used in the in the process. Checkbox 354 from the options dialog pauses the program every time two X-refs with the same name are encountered, such as when more than one version of an X-ref file exists on the system. In certain embodiments, a user prompt displays all the X-ref files with the same name, from which the user can select the desired X-ref and click the "OK" button. For example, a user may be informed that the latest version of an X-ref is corrupted. In this case, the user can manually select to use the previous version of the X-ref when processing the X-refs.

Checkbox 356 sets the option for the system to create a blank X-ref (e.g., a proxy or dummy drawing) for each missing X-ref that is reported and/or to associate the blank X-ref with the missing X-ref. Checkbox 358 sets the option to have all blank X-ref(s) placed in the host directory. Checkbox 360 sets the option to have all blank X-ref(s) placed in a sub-folder under the Host directory. As shown, the illustrated dialog box 350 further includes a window that provides the user with a text input window to assign a name to a sub-folder for storing blank X-refs.

Once a drawing has been categorized and properly associated with other drawings and/or has been cleaned up, it is often desirable to compare that drawing to prior versions of the same drawing to view what has been changed from one revision or delta to another. While drawings that have not been cleaned up can also be compared to prior drawings, unnecessary information cluttering an unclean drawing can make it difficult for a user to visually discern where changes have or have not been made. Thus, certain embodiments of the invention can provide a compare utility that greatly simplifies the process of understanding and working with revisions, identifying where changes have occurred, and highlighting those revisions by colorization in a highly efficient and user friendly manner.

Naturally, the compare feature of certain embodiments of the invention is also capable of comparing any two drawings, even where one is not a revision of the other. When the system detects that two drawings to be compared are not similar, it can alert the user and/or prompt the user for confirmation to move forward with the compare process. As noted below with respect to FIGS. 12A and 13A, the Batch Load compare feature of certain embodiments of the invention can be useful when comparing a large number of both similar and dissimilar drawings. For example, when a user is attempting to determine the degree of commonality between the drawings of different floors of a multistory building, the ability to batch compare a large number of drawings, including those which are dissimilar, can be very advantageous. In this manner, the one or two dissimilar floors out of 30 or 40 similar floors can be picked out relatively quickly.

In certain embodiments, the compare utility allows the user to view any changes that have or have not been made from one version of a CAD drawing to another. Any revisions that have or have not been made can be readily viewed to determine what the modifications are and whether those modifications, or lack thereof, are relevant to the user's work on the current drawing. The disclosed compare utility can also contain a preview feature that allows the user to view all changes to the drawing prior to accepting or importing the drawing into other CAD formats.

In certain embodiments, the compare utility also has the ability to zoom in on a filtered set of drawing elements/objects and the ability to continue to drill down into the drawing to the simplest drawing component of each individual component group or object. This allows the user to automatically zoom in and view a first selected group of components, and then zoom in and view a smaller section or components within that first selected group, and then zoom in again and view an even smaller set of components, and so forth. At any time during this process, the user can select components and capture information about those components to include those components and information in a bill of materials, scheduling program, etc. This feature is of particular importance in BIM projects.

Figure 11A:
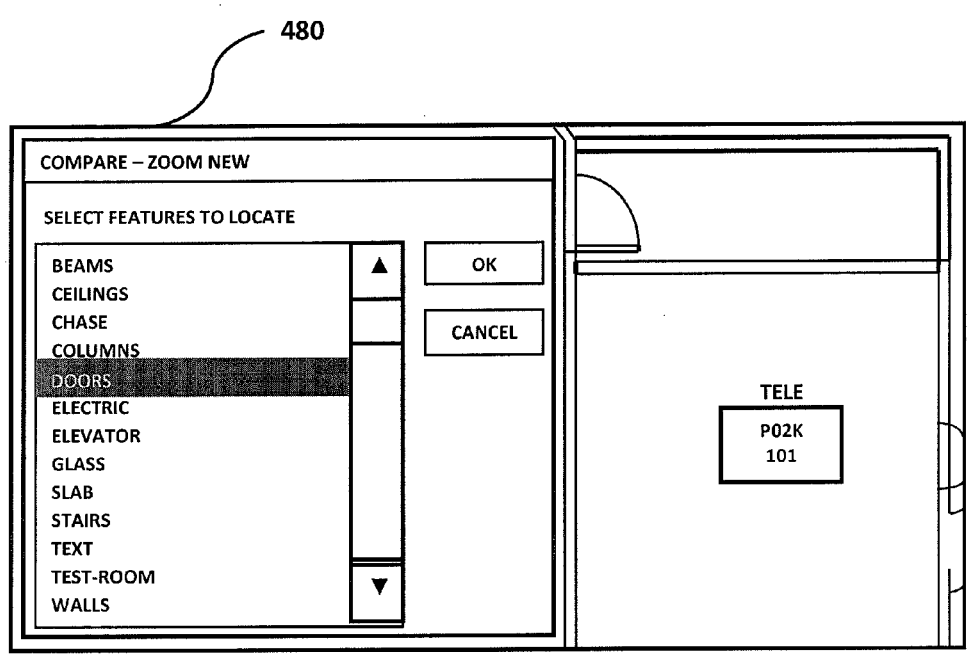
FIG. 11A illustrates an example dialog box for a compare zoom feature, in accordance with certain embodiments of the invention.

For example, as illustrated in FIG. 11A, a compare zoom dialog box 480 can be used for zooming in on particular objects in a revised drawing, such as newly added walls. In certain embodiments, this is performed by selecting the desired object from a list of available objects. The system can then zoom on any of the selected objects that were added to a revised drawing. In certain further embodiments, the newly added objects can be further distinguished, such as being illustrated in a different color (or highlighted in some other way), from the unchanged objects in the revised drawing.

The compare zoom feature can also take into account BIM or other data in the revised drawing. For instance, in order to prepare pricing information for the added walls, or to revise scheduling to accommodate the added walls, the system can capture information related to all the changes involved in adding the walls, including all parts that might have been included within the walls, such as the wood or metal studs and slats, the sheetrock, the attachment screws, the door frames, the doors and all door components, including hinges, door knobs, or the like.

Once the information on the changes has been collected, a bill of materials can be automatically generated and sent to the appropriate program or system for processing. Likewise, if the user comparing the drawings happens to be the hardware manufacturer for the door systems, the user can continue to drill down with the zoom command to just capture the door hardware for all the added doors in the revised drawing and nothing else.

Certain inventive systems and methods disclosed herein can further enable a user to select an entity and drill down to an attribute layer having data comprising, among other things, a detailed bill of materials for a particular member, or group of members of the drawing. For example, if a user selects a drawing member representing a door, the user is able to zoom down through several layers to view the bill of materials necessary to build the door and any other equivalent doors and/or components (e.g., knobs, hinges, locks, etc.).

In another example, a user may select one or more attribute blocks corresponding to a drawing member or group of members, and then zoom down through several layers each having relevant bill of materials for the selected drawing member or group of members. In yet another example, the user may select an attribute block representing each room of a floor of a hotel or other building. A first layer may provide that each room requires a bathroom; a second layer may provide that each bathroom requires a bathtub, a sink, and a toilet; and a third layer may provide that the bathtub should be of a certain manufacturer, model and dimensions, such an AMERICAN STANDARD model number X bathtub five feet long and 30 inches wide.

Figure 11B:
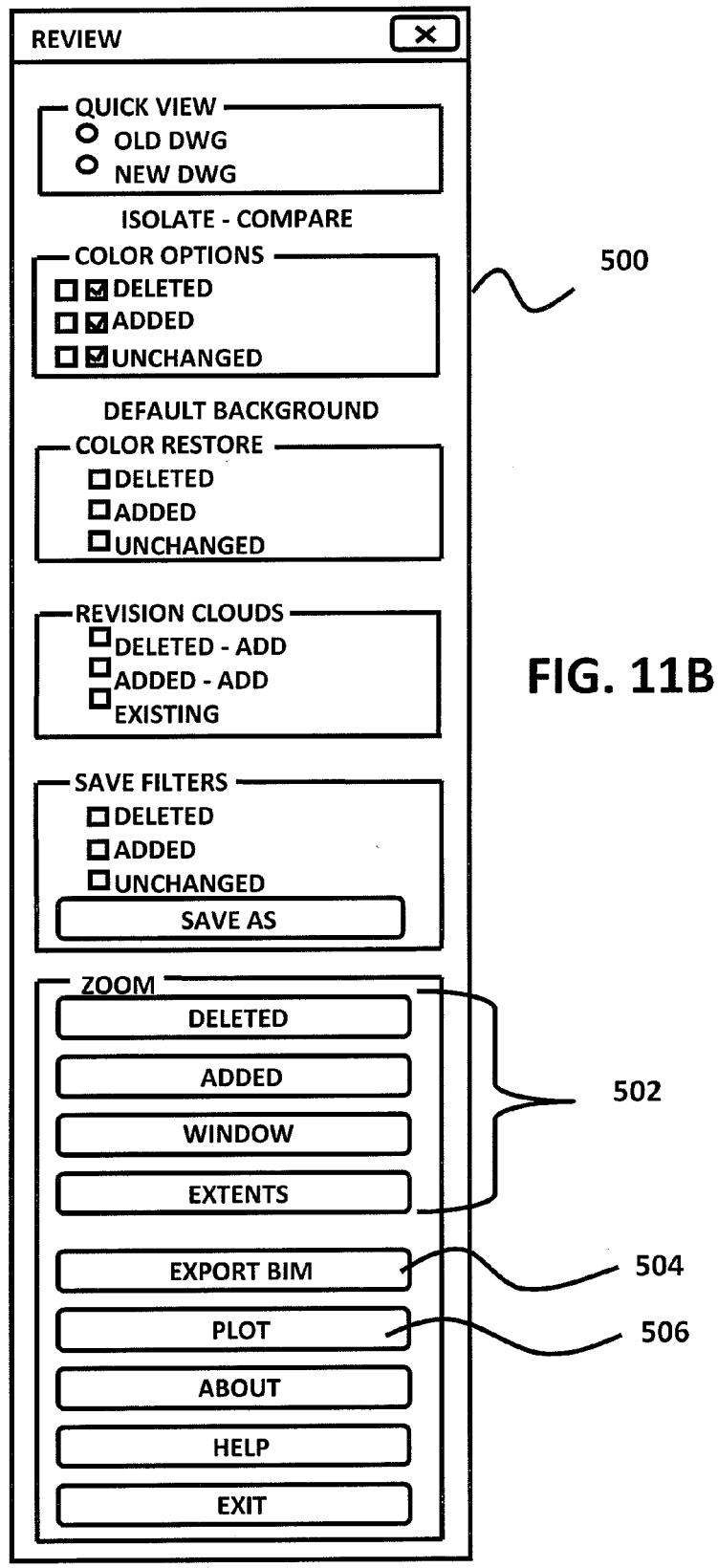
FIG. 11B illustrates an example dialog box of a review utility, in accordance with certain embodiments of the invention.

FIG. 11B illustrates a screen display of a review utility dialog box 500 that provides a user with access to the above-described BIM-zoom features. In particular, the dialog box 500 comprises a plurality of inputs (e.g., buttons, checkboxes) for receiving user instructions regarding the review of BIM features.

As shown, BIM zoom buttons 502 enable the user to zoom to data regarding deleted or added elements, when compared to a previous version of the drawing. The "Export BIM" button 504 brings up a prompt and/or dialog box for the user to provide a location for where to export BIM data and optionally, a user selected format for the BIM data to be converted to for export. For example, Export BIM button 504 may present several MICROSOFT EXCEL formats for the user to choose from. The BIM data pertaining to the relevant changes can then be exported directly into an EXCEL spreadsheet of the desired formatting. A "Plot Button" 506 further enables the user to have BIM data sent to a plotter for printing.

An additional feature of the compare utility is its ability to determine and display changes in square footage based on changes between the old drawing and the new drawing. As with other features, changes in square footage can be determined on the macro-level (e.g., the entire building) or on any of a number of selected lower levels (e.g., a particular floor). For example, if the user only wanted to determine the change in square footage on a level of a building, this could be determined by comparing that level of the building from the old drawing to that level of the building from the new drawing. Likewise, one room or set of rooms could be compared between the two drawings to determine square footage changes between the old and new drawings. Altered square footage could also include the amount of square footage in the drawing that includes revisions or changes and the total variance between the old and new drawings. In certain embodiments, other variances are also identified and/or reported, such as X-refs attached to the old versus new drawings, X-refs inserted into the old versus new drawings, the status of various layers at the time the comparisons were completed (e.g., whether all layers were included, whether frozen layers were included, whether locked layers were included, etc.).

Figure 12A:
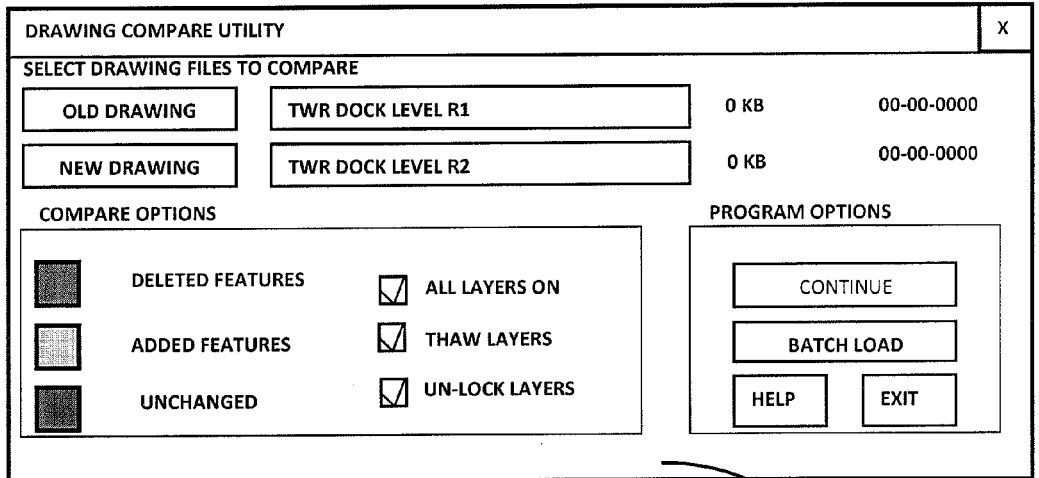
FIGS. 12A through 12C illustrate example dialog boxes for a comparison feature, in accordance with certain embodiments of the invention.

To initiate the process, as illustrated in FIG. 12A, a Drawing Compare Utility dialog box 710 prompts the user to select the base drawing (such as the original drawing or a prior revision drawing) and the currently revised drawing. The user is also provided with options for customizing the comparison process. The options can include, for example:

(1) "All Layers On," which results in all layers being turned on in each drawing (if unchecked, only layers that are turned on in each drawing would be compared, with turned off layers being ignored);

(2) "Thaw Layers," which thaws any frozen layers so they can be included in the comparison (otherwise frozen layers are ignored); and (3) "Un-Lock Layers," which un-locks any locked layers, which would otherwise be ignored.

Figure 12C:
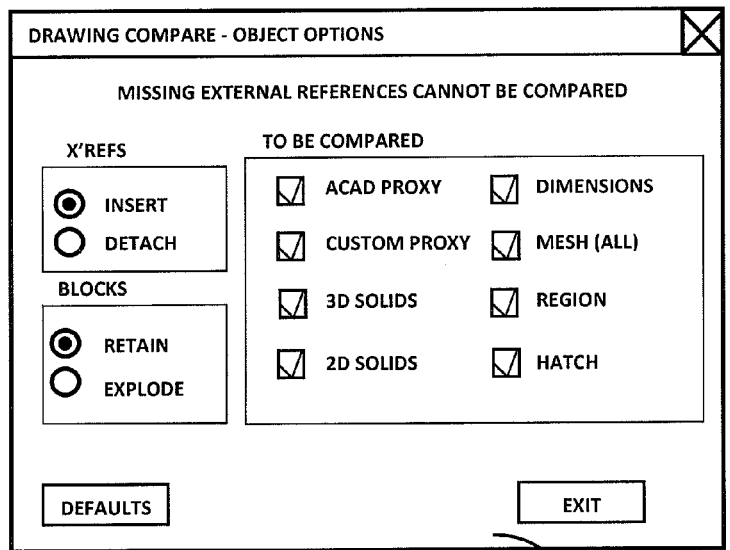
Figure 12B:
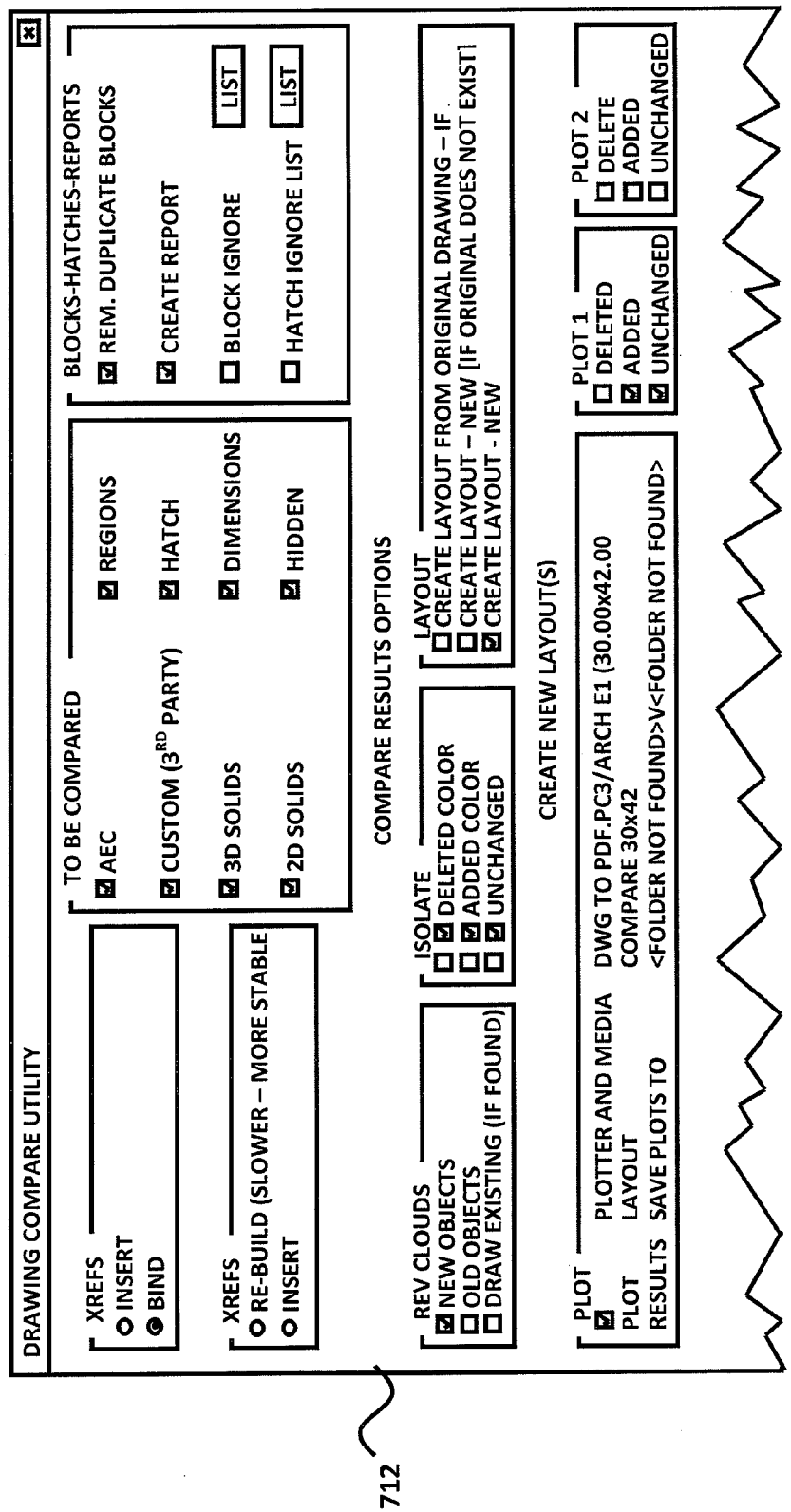

FIG. 12B illustrates a dialog box 712 that enables the user to set additional options for the Drawing Compare Utility, such as how X-refs are to be treated, selection of aspects of the drawings to be compared, configuration of the presentation of the compare results and creation of new layouts.

As previously noted, in addition to these drawing options, the dialog box 710 contains a program option to "batch load" several drawings or a complete set of both base and revision drawings to allow the user to toggle through numerous drawings or an entire set of revised drawings one at a time. The ability to batch compare several drawings and have the system automatically perform the operation (e.g., overnight) without further user input is a very useful feature, especially when used in combination with the crash log processes described herein.

Figure 13A:
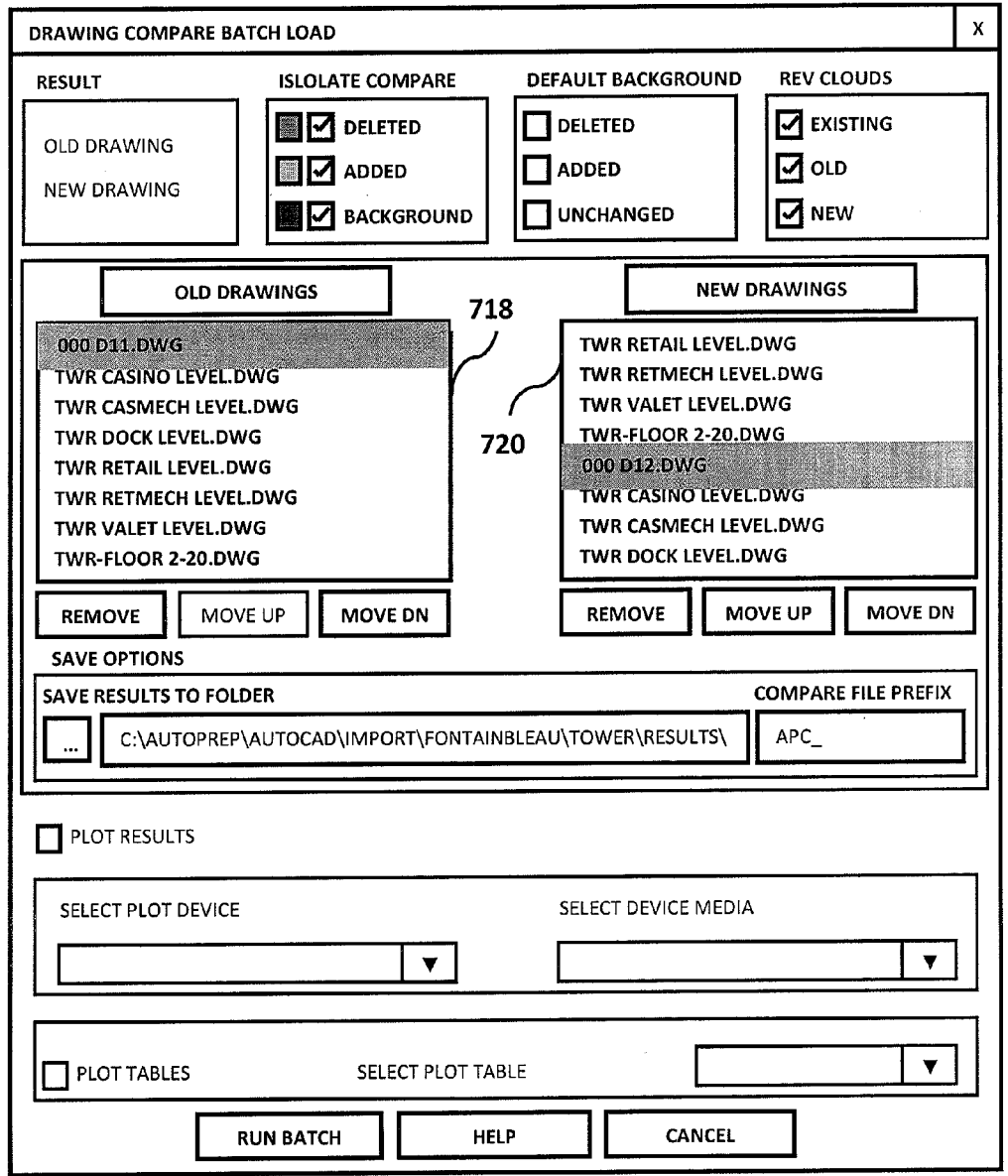
FIG. 13A illustrates an example dialog box for a batch load utility, in accordance with certain embodiments of the invention.

As illustrated in FIG. 13A, a Batch Load dialog box 716 allows the user to place hundreds of drawings (e.g., up to 1024) in an old drawing file list 718 and hundreds more in a revised drawing list 720, in any order, and the system will automatically find all the similar drawings to compare to one another and perform the comparison functions automatically. If any drawing in the new drawing list is missing a corresponding revised drawing, or for any reason a drawing could not be compared, the system will provide an error message list.

As noted above, the batch compare process can be used to compare one drawing to many different similar or dissimilar drawings. More specifically, the batch compare process can be used to compare each drawing in a set of drawings, such as a floor, building or other structure, to each corresponding drawing in a prior or subsequent set of drawings related to the same floor, building or other structure. Changes identified from the comparison can be entered on an itemized list of changes and/or can be shown in the drawings through various forms of highlighting. It is also possible to compare each subpart of a drawing or group of drawings with corresponding subparts of other drawings or groups of drawings. Moreover, certain filters can be further applied to cause only certain features within drawings that have changed to be output to the itemized list or only certain changes to be illustrated as changed within the resulting compare drawing.

Moreover, clean-up and compare features can be advantageously combined together, such that once all the drawings in a batch of drawings have been cleaned up, those drawings can be automatically compared to one another or other drawings selected by the user. When the comparison(s) are completed, a Plot, PDF or DXF format file, or any other type of file type, of the compare drawing(s) can be generated to display and/or highlight added objects, deleted objects, modified objects, combinations of the same or the like, as previously discussed herein.

Figure 13B:
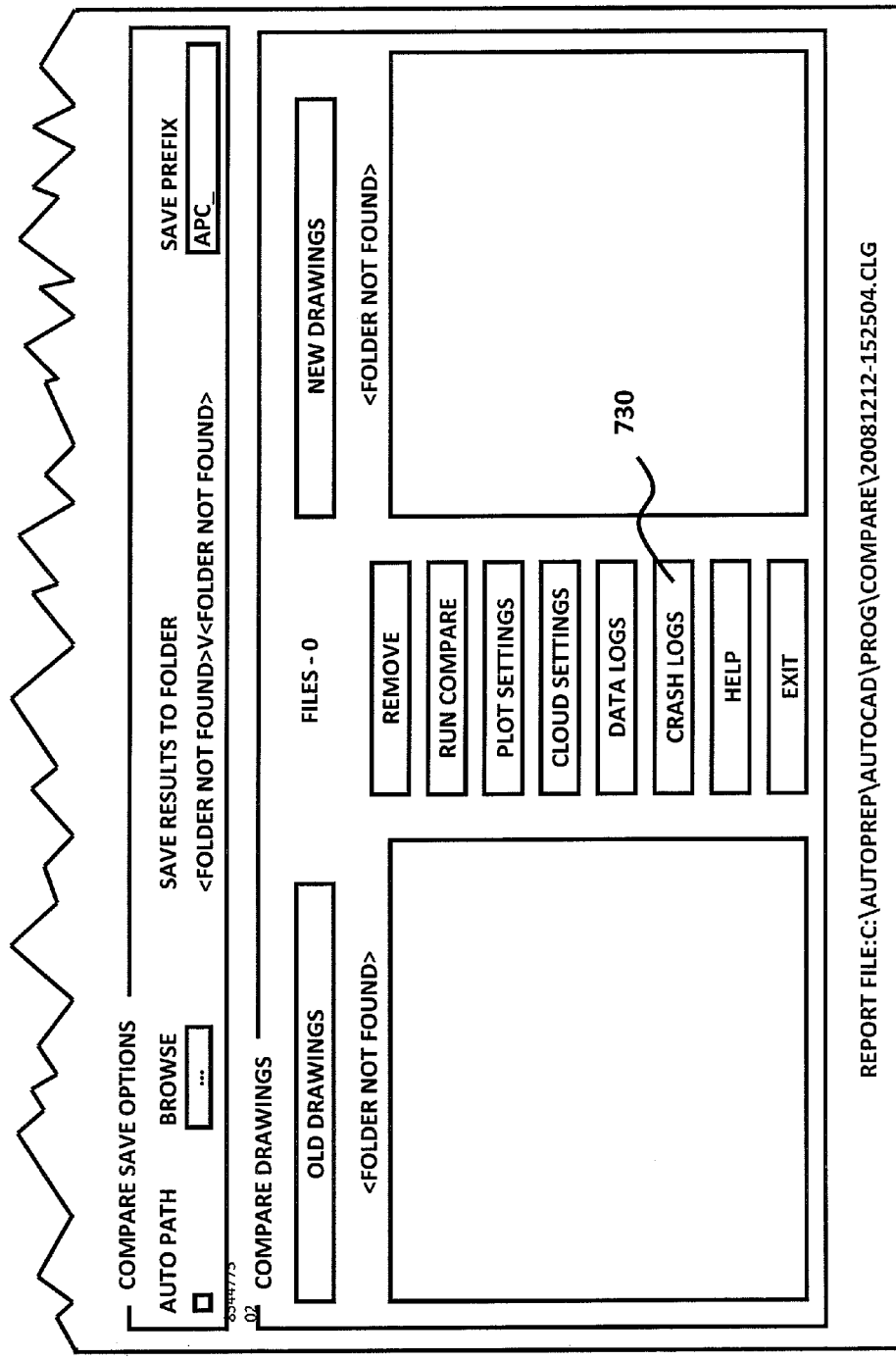
FIG. 13B illustrates an example screen display of a bottom portion of a batch compare utility dialog box, in accordance with certain embodiments of the invention.

As referenced above, the batch compare or clean-up methods described herein can advantageously continue comparing or cleaning up batches (sets) of drawings even after encountering a seemingly fatal error. For instance, FIG. 13B illustrates the bottom portion of a batch compare utility dialog box 729, as an example, that is similar to the batch compare dialog box 716 illustrated in FIG. 13A, except that the dialog box 729 includes an additional crash log utility option 730 that enables continuous comparisons even after an event occurs which would normally crash a batch comparison process, as discussed above, for example with respect to the process 210 of FIG. 10F.

In particular, if during the course of a batch comparison the system encounters a problem that would cause the compare or clean-up process to crash, such as encountering a problematic X-ref (i.e., an X-ref that references itself or includes a reference to an X-ref that cannot be found) a broken X-ref, or a corrupt X-ref, the crash log utility automatically creates and saves to the appropriate drawing, file and/or database being compared or cleaned-up a proxy reference (e.g., dummy drawing 430 of FIG. 10K) that is used in place of the problematic data structure. For example, for a recursive X-ref, the crash log utility can automatically create a proxy reference that is used in place of the recursive X-ref.

The use of a proxy reference in place of a problematic data structure is usually inconsequential to the comparison or clean-up process being performed because the problematic data structure oftentimes has a small role in the overall drawing. For example, a recursive or missing X-ref is frequently created as a result of an improper revision to the X-ref. For instance, problems can arise when the user deletes an X-ref that is no longer needed, but does not delete the link to the X-ref. Without the proxy feature of the crash log utility, a system or CAD program performing a batch compare or clean up can crash as a result of the problem, thereby interrupting processing of the remainder of the drawings scheduled for the batch process. Since batch processes are often run without user supervision over an extended period of time, such as during off hours, such crashes can result in a substantial loss of computing time and efficiency.

Figure 13C:
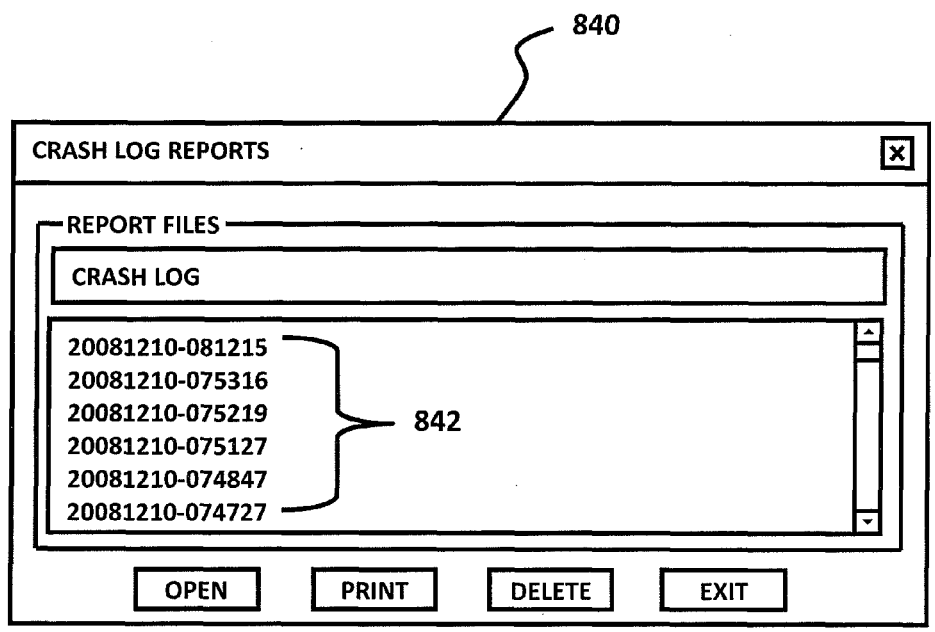
FIG. 13C illustrates an example dialog box for a crash log reports utility, in accordance with certain embodiments of the invention.

As discussed above, in certain embodiments, when a proxy reference is created, the crash log utility creates a record in a file (e.g., the crash log) so that information about the problematic data structure can be subsequently accessed by the user. For instance, when the user selects the crash log utility button 730 of dialog box 729, a crash log reports dialog box 840 can be presented to the user, an example of which is illustrated in FIG. 13C. As shown, the crash log reports dialog box 840 presents a listing of the various averted crashes in a crash listing 842. The crash log or crash listing 842 can also advantageously provide additional data for each averted crash. For example, the crash listing 842 can further include for each averted crash: a time of occurrence, a host drawing number/name, a missing X-ref number/name, combinations of the same or like information those skilled in the art would consider useful.

Thus, it will be understood from the disclosure herein that the batch comparing of CAD drawings can advantageously be performed in connection with the crash log process 210 illustrated in FIG. 10F. For instance, because batch comparing can require a substantial amount of time and/or processing resources, such comparing can be preferably performed overnight. In order to avoid an unanticipated error from terminating prematurely the entire batch comparison, the crash log process can be used to detect and record the probable causes of crashes and allow the batch comparison to continue (e.g., with dummy drawings used in place of identified broken or corrupt X-refs).

A number of conversion options during a compare process can also be selected by the user as shown by a comparison options dialog box 714 in FIG. 12C. For instance, the comparison options dialog box 714 can be used for assisting in the conversion of objects from any type of CAD or other drawing program, such as AUTOCAD, into any type of third-party program, such as AUTOSPRINK. The "X-refs" option gives the user the ability to insert X-refs that are attached to the drawings to be compared (which is the default setting), or to ignore X-refs in the drawings to be compared. The "Blocks" option gives the user the ability to retain blocks as blocks, or to cause the blocks to be expanded (exploded) into the drawings as their individual elements. Since proxy objects may be useful to some users when comparing results, the "ACAD Proxy" option either compares AUTOCAD proxy objects (when checked) or ignores them, while the custom proxy option gives users the same option for non-AUTOCAD proxy objects.

The "3D solids" and "2D solids" options of dialog box 714 give the user the ability to selectively compare such objects. Likewise, selecting the remaining checkboxes either causes the specified objects (e.g., dimensions, polygons and polyface meshes), regions and hatches, to be compared or ignored.

In certain embodiments, once all the options have been selected, the compare process begins by placing the base drawing file into an editor that individually reads all the objects or entities and their associated properties, converts all the graphical objects to text, and places the text in an array. The text and properties are then written out to storage through a compressor that truncates the properties as much as possible without losing data. When all the different types of objects have been processed, the editor is purged and the revised drawing is inserted for processing in the same manner.

The text files generated from the compressor are then opened by object type (e.g., line, circle, etc.). Lines from the base drawing file are read and placed in an array, while lines from the revised drawing file are read and placed in a separate array. The two arrays are then compared and the results are drawn from the editor. This process is repeated for all entities or objects in the drawing files. Once all the entities or objects have been compared and drawn from the editor, the compare drawing is saved according to the user defined settings and options of FIGS. 12A-12C. The original makeup (layer structure) of the old and new drawings is stored to the compare drawing.

In addition to storing the layer structure, several types of non-object data can also be stored, such as the status of X-refs, blocks and other settings. As previously noted, this enables variance square foot measurements to be calculated, but also allows information to be stored about the user, the workstation being used, date, time, combinations of the same or the like. The user also has the option to send the compare drawing to other parties (e.g., as a digital plot, bitmap, JPEG or other file) along with notes and other details that enable the receiving party to perform a task based on the information they were sent, which is useful in the BIM context. Compare files can also be assigned to specific directories and those directories can then be assigned or shared with interested parties.

Systems and methods disclosed herein have applicability to any trade involved in the CAD building design process, or with respect to any type of CAD drawing system, whether the system is being used to design roads, bridges, buildings, automobiles, aircraft or the like. For instance, with the execution of an appropriate command, inventive systems and methods can perform a check of objects within a drawing to determine if any conflicts exist between any objects. Moreover, in the context of a building design, each conflict can be detected and then be designated by trade. For instance, the steel trade (e.g., columns and beams) can be designated separately from HVAC, plumbing, electrical, fire sprinkler, or any other trade. To visually highlight each conflict, an area surrounding the conflict can be surrounded by a three-dimensional translucent alert bubble element that permits a clear view of the obstructed situation, while drawing the user's attention to the conflict.

Furthermore, in certain embodiments, the systems and methods described herein can advantageously be implemented using computer software, hardware, firmware, or any combination of software, hardware and firmware. In certain embodiments, systems are implemented as a number of software modules that comprise computer executable code for performing the functions described herein. In certain embodiments, the computer-executable code is executed on one or more general purpose computers. However, a skilled artisan will appreciate, in light of this disclosure, that any module that can be implemented using software to be executed on a general purpose computer can also be implemented using a different combination of hardware, software or firmware. For example, such a module can be implemented completely in hardware using a combination of integrated circuits. Alternatively or additionally, such a module can be implemented completely or partially using specialized computers designed to perform the particular functions described herein rather than by general purpose computers.

Moreover, certain embodiments of the invention are described with reference to methods, apparatus (systems) and computer program products that can be implemented by computer program instructions. These computer program instructions can be provided to a processor of a general purpose computer, special purpose computer, or other programmable data processing apparatus to produce a machine, such that the instructions, which execute via the processor of the computer or other programmable data processing apparatus, create means for implementing the acts specified herein to transform data from a first state to a second state.

These computer program instructions can be stored in a computer-readable memory that can direct a computer or other programmable data processing apparatus to operate in a particular manner, such that the instructions stored in the computer-readable memory produce an article of manufacture including instruction means which implement the acts specified herein.

The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the acts specified herein.

Although the inventions herein have been disclosed in the context of certain preferred embodiments, examples and variations, it will be understood by those skilled in the art that the present invention extends beyond the specifically disclosed embodiments to other alternative embodiments and/or uses of the invention and obvious modifications and equivalents thereof. In addition, while a number of variations of the inventions have been shown and described in detail, other modifications, which are within the scope of this invention, will be readily apparent to those of skill in the art based upon this disclosure. It is also contemplated that various combinations or subcombinations of the specific features and aspects of the embodiments may be made and still fall within the scope of the invention.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

It should further be understood that various features and aspects of the disclosed embodiments can be combined with or substituted for one another in order to form varying modes of the disclosed invention. It also should be understood that various features and aspects of the embodiments disclosed in the applications incorporated by reference above can be combined with or substituted for one another in order to form varying systems and methods for managing and/or processing CAD drawings. Moreover, some variations that have been described with respect to one embodiment and not another embodiment can be used with such other embodiments. Many other variations also have been described herein and cross-application is intended where physically possible. Thus, it is intended that the scope of the present invention herein disclosed should not be limited by the particular disclosed embodiments described above, but should be determined only by a fair reading of the claims that follow.

What is claimed is:

1. A method for processing a batch of computer aided design (CAD) drawings, the method comprising:
    opening a first session of a CAD application on a computing device;
    storing an identification of a first CAD drawing in a first data structure;
    during the first session of the CAD application, initiating a second session of the CAD application to process the first CAD drawing, wherein the first CAD drawing comprises a plurality of external references to a plurality of external drawings associated with and external to the first CAD drawing; and
    processing the plurality of external references to the plurality of external drawings of the first CAD drawing, wherein said processing comprises,
        selecting one of the plurality of external references,
        storing in the first data structure an identification of the external drawing corresponding to the selected external reference,
        attempting with the second session to link the corresponding external drawing to the first CAD drawing,
        monitoring with the computing device said attempting to link by the second session,
        when said attempting to link by the second session is successful, clearing the first data structure of at least the identification of the external drawing corresponding to the selected external reference and continuing to process, with the second session, another one of the plurality of external references if all the plurality of external references have not been processed,
        when said attempting to link by the second session is not successful,
            storing in a second data structure, with the first session, the identification of the first CAD drawing and the identification of the external drawing corresponding to the selected external reference, and
            closing the second session of the CAD application.

2. The method of claim 1, additionally comprising, when said attempting to link by the second session is not successful, replacing the external drawing corresponding to the selected external reference with a blank CAD drawing.

3. The method of claim 2, additionally comprising, following said replacing, initiating another session of the CAD application to process any of the plurality of external references that were not processed by the second session.

4. The method of claim 1, wherein said monitoring by the computing device comprises determining if the second session is inactive for more than a predetermined time period.

5. The method of claim 4, wherein the predetermined time period comprises at least ten seconds.

6. The method of claim 1, wherein said monitoring by the computing device comprises determining if a predetermined event is performed by the second session.

7. The method of claim 6, wherein the predetermined event comprises issuing a command to display a window on a user interface.

8. The method of claim 1, wherein said attempting to link comprises an instruction to bind the corresponding external drawing to the first CAD drawing.

9. The method of claim 1, wherein said attempting to link comprises an instruction to insert the corresponding external drawing into the first CAD drawing.

10. The method of claim 1, wherein the first data structure comprises a text file.

11. The method of claim 1, wherein the first session of the CAD application comprises a blank session with no CAD drawing being processed by the first session.

12. A system for processing a batch of computer aided design (CAD) drawings, the system comprising:
- at least one storage device configured to store a plurality of CAD drawings;
- a first instance of a CAD application executing on at least one computing device;
- a first data structure configured to store an identification of a first one of the plurality of CAD drawings, wherein the first CAD drawing comprises external references to a plurality of external drawings associated with and external to the first CAD drawing;
- a second instance of the CAD application initiated by the first instance of the CAD application to process the first CAD drawing by attempting to individually link each of the external referenced external drawings to the first CAD drawing, wherein the second instance of the CAD application is further configured to,
    - store in the first data structure an identification of each external referenced external drawing to be linked prior to attempting to individually link the external referenced external drawing, and
    - remove from the first data structure the identification of the external referenced external drawing after successfully linking the external referenced external drawing to the first CAD drawing;
- wherein the computing device is further configured to monitor the second instance of the CAD application to detect an error event during said processing of the first CAD drawing by the second instance of the CAD application that interrupts said processing by the second instance of the CAD application,
- and wherein the computing device is configured to, upon detection of the error event, store to a second data structure the identification of the external referenced external drawing stored in the first data structure at the time the error event was detected.

13. The system of claim 12, wherein said attempting to individually link comprises attempting to bind the external referenced external drawings to the first CAD drawing.

14. The system of claim 12, wherein the detected error event comprises a predetermined time interval in which the second instance of the CAD application is inactive.

15. The system of claim 12, wherein the second instance of the CAD application is configured to serially attempt to link the external referenced external drawings.

16. The system of claim 12, wherein the computing device is further configured to terminate the second instance of the CAD application after detecting the error event.

17. The system of claim 16, wherein, following the detection of the error event, the computing device is configured to automatically initiate a new instance of the CAD application to link a proxy drawing in place of the external referenced external drawing stored in the first data structure at the time the error event was detected.

18. The system of claim 17, wherein the new instance of the CAD application is further configured to attempt to link additional external referenced external drawings not processed by the second instance of the CAD application prior to the detection of the error event.

* * * * *